(12) United States Patent
Wagatsuma et al.

(10) Patent No.: US 10,811,264 B2
(45) Date of Patent: Oct. 20, 2020

(54) FILM-FORMING METHOD AND FILM-FORMING APPARATUS

(71) Applicant: TOKYO ELECTRON LIMITED, Tokyo (JP)

(72) Inventors: Yuichiro Wagatsuma, Nirasaki (JP); Miyako Kaneko, Nirasaki (JP); Naotaka Noro, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/111,792

(22) Filed: Aug. 24, 2018

(65) Prior Publication Data

US 2019/0067015 A1    Feb. 28, 2019

(30) Foreign Application Priority Data

Aug. 30, 2017    (JP) .................................. 2017-165844

(51) Int. Cl.

| | |
|---|---|
| *H01L 21/285* | (2006.01) |
| *C23C 16/458* | (2006.01) |
| *C23C 16/44* | (2006.01) |
| *C23C 16/34* | (2006.01) |
| *C23C 16/24* | (2006.01) |

(52) U.S. Cl.
CPC ........ *H01L 21/28556* (2013.01); *C23C 16/24* (2013.01); *C23C 16/34* (2013.01); *C23C 16/345* (2013.01); *C23C 16/4404* (2013.01); *C23C 16/4581* (2013.01); *H01L 21/28568* (2013.01)

(58) Field of Classification Search
CPC ... C23C 16/34; C23C 16/24; C23C 16/45525; C23C 16/4404; C23C 16/4581; C23C 16/345; H01L 21/28568; H01L 21/32051; H01L 21/28556
See application file for complete search history.

(56) References Cited

U.S. PATENT DOCUMENTS

| | | | |
|---|---|---|---|
| 2003/0108674 A1* | 6/2003 | Chung | .................... C23C 16/34 427/255.394 |
| 2007/0087579 A1* | 4/2007 | Kitayama | ........... C23C 16/4405 438/778 |

(Continued)

FOREIGN PATENT DOCUMENTS

| | | |
|---|---|---|
| JP | 200568559 A | 3/2005 |
| JP | 201065309 A | 3/2010 |

(Continued)

*Primary Examiner* — Joseph C. Nicely
(74) *Attorney, Agent, or Firm* — Nath, Goldberg & Meyer; Jerald L. Meyer

(57) ABSTRACT

There is provided a film-forming method, including: a pre-coating process of supplying a first gas containing silicon into a processing container in which a substrate is not loaded, and coating surfaces of members installed inside the processing container, including a mounting table configured to mount the substrate thereon, with a film made of silicon; subsequently, a mounting process of mounting the substrate on the mounting table so that a back surface of the substrate is in contact with the film made of silicon; and subsequently, a film-forming process of supplying a second gas containing an organometallic compound into the processing container, and forming a film made of a metal constituting the organometallic compound on the substrate.

8 Claims, 17 Drawing Sheets

(56) References Cited

U.S. PATENT DOCUMENTS

| | | | |
|---|---|---|---|
| 2009/0061092 A1* | 3/2009 | Kameshima | C23C 16/4581 427/255.394 |
| 2010/0163862 A1* | 7/2010 | Yang | H01L 27/1214 257/43 |
| 2015/0076437 A1* | 3/2015 | Tao | H01L 45/14 257/4 |
| 2017/0204505 A1* | 7/2017 | Okabe | H01J 37/32715 |
| 2018/0337026 A1* | 11/2018 | Firouzdor | C23C 16/40 |
| 2019/0144994 A1* | 5/2019 | Okada | C23C 16/4405 438/478 |
| 2019/0348448 A1* | 11/2019 | Yamazaki | H01L 51/525 |
| 2019/0368035 A1* | 12/2019 | Malik | C23C 16/40 |

FOREIGN PATENT DOCUMENTS

| | | | | |
|---|---|---|---|---|
| JP | 2013-145796 A | 7/2013 | | |
| KR | 10-2006-0060731 A | 6/2006 | | |
| TW | 201339351 A | 10/2013 | | |
| WO | 2005098922 A1 | 10/2005 | | |
| WO | WO-2006109735 A1 * | 10/2006 | ......... | C23C 16/4404 |
| WO | 2013105389 A1 | 7/2013 | | |

* cited by examiner

Step S3

Step S4

Step S5

Step S7

Step S11

FILM-FORMING METHOD AND FILM-FORMING APPARATUS

CROSS-REFERENCE TO RELATED APPLICATION

This application is based upon and claims the benefit of priority from Japanese Patent Application No. 2017-165844, filed on Aug. 30, 2017, the entire contents of which are incorporated herein by reference.

TECHNICAL FIELD

The present disclosure relates to a technique for forming a thin film inside a processing container and subsequently forming a film on a substrate.

BACKGROUND

In a process of manufacturing a semiconductor device, a metal film such as a titanium nitride (TiN) film is formed on a semiconductor wafer (hereinafter referred to as a wafer) as a substrate by, for example, ALD (Atomic Layer Deposition). Prior to forming a film on a wafer in this manner, pre-coating for forming a thin film on surfaces of various members installed inside a processing container, such as a mounting table on which a wafer is mounted, a shower head for supplying a gas into the processing container, and so on, is performed. Such a pre-coating prevents particles adhering to the surfaces of the members inside the processing container from scattering to the wafer.

In order to prevent another type of metal other than the metal constituting the metal film to be formed on the wafer from adhering to the wafer, for example, a pre-coating is formed so as to form a film of the same type as a film to be formed on the wafer inside the processing container. For example, a technique for pre-coating a TiN film inside a processing container by ALD using a titanium tetrachloride ($TiCl_4$) gas as a precursor and a reaction gas reacting with the $TiCl_4$ gas, and subsequently, forming a TiN film on a wafer, has been used.

Hereinafter, for the sake of convenience in description, a film formed on a member in a processing container by pre-coating may be referred to as a pre-coating film, and a film formed on a wafer may be referred to as a target film. In some cases, a TiN film as the target film is formed so as to contain silicon (Si). Meanwhile, there is a demand to prevent chlorine from being contained as an impurity in the target film and it has been studied to use an organometallic compound not containing the chlorine as a precursor. For this end, when forming a TiN film as the target film, it is considered to use, for example, tetrakisdimethylaminotitanium (TDMAT) as a precursor instead the above $TiCl_4$. However, as will be described later in an evaluation test, when the pre-coating film, which is the TiN film, is formed using this TDMAT, it was confirmed that the amount of titanium (Ti) adhering to a back surface of the wafer became relatively large.

Therefore, it is considered that a TiN film as the pre-coating film is formed by $TiCl_4$ and a TiN film as the target film is formed by TDMAT. However, even when a film forming process was performed using the different precursors, it was confirmed that the amount of Ti adhering to the back surface of the wafer was relatively large. It is considered that this is caused by cracking of the pre-coating film due to the decrease in internal temperature of the processing container performed after forming the pre-coating film and before forming the target film. The reason for this will be described in detail in the Detailed Description section of the present disclosure. Under such circumstances, there is a demand for a technique capable of preventing the wafer from being contaminated with metal. Further, there is a need to simplify the configuration of a film-forming apparatus by limiting the number of kinds of gases not used to form the target film.

SUMMARY

Some embodiments of the present disclosure provide a technique for preventing a back surface of a substrate from being contaminated with metal when forming a film on the substrate using a gas containing an organometallic compound.

According to one embodiment of the present disclosure, there is provided a film-forming method, including: a pre-coating process of supplying a first gas containing silicon into a processing container in which a substrate is not loaded, and coating surfaces of members installed inside the processing container, including a mounting table configured to mount the substrate thereon, with a film made of silicon; subsequently, a mounting process of mounting the substrate on the mounting table so that a back surface of the substrate is in contact with the film made of silicon; and subsequently, a film-forming process of supplying a second gas containing an organometallic compound into the processing container, and forming a film made of a metal constituting the organometallic compound on the substrate.

According to another embodiment of the present disclosure, there is provided a film-forming apparatus which includes: a mounting table installed in a processing container and configured to mount a substrate thereon; a first gas supply part configured to supply a first gas containing silicon into the processing container; a second gas supply part configured to supply a second gas containing an organometallic compound into the processing container; and a control part configured to output a control signal to perform a process including: supplying the first gas into the processing container in which the substrate is not loaded, and coating surfaces of members installed inside the processing container, including the mounting table, with a film made of silicon; and subsequently, supplying the second gas into the processing container with the substrate mounted on the mounting table inside the processing container with a back surface of the substrate being in contact with the film made of silicon, and forming a film made of metal constituting the organometallic compound on the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
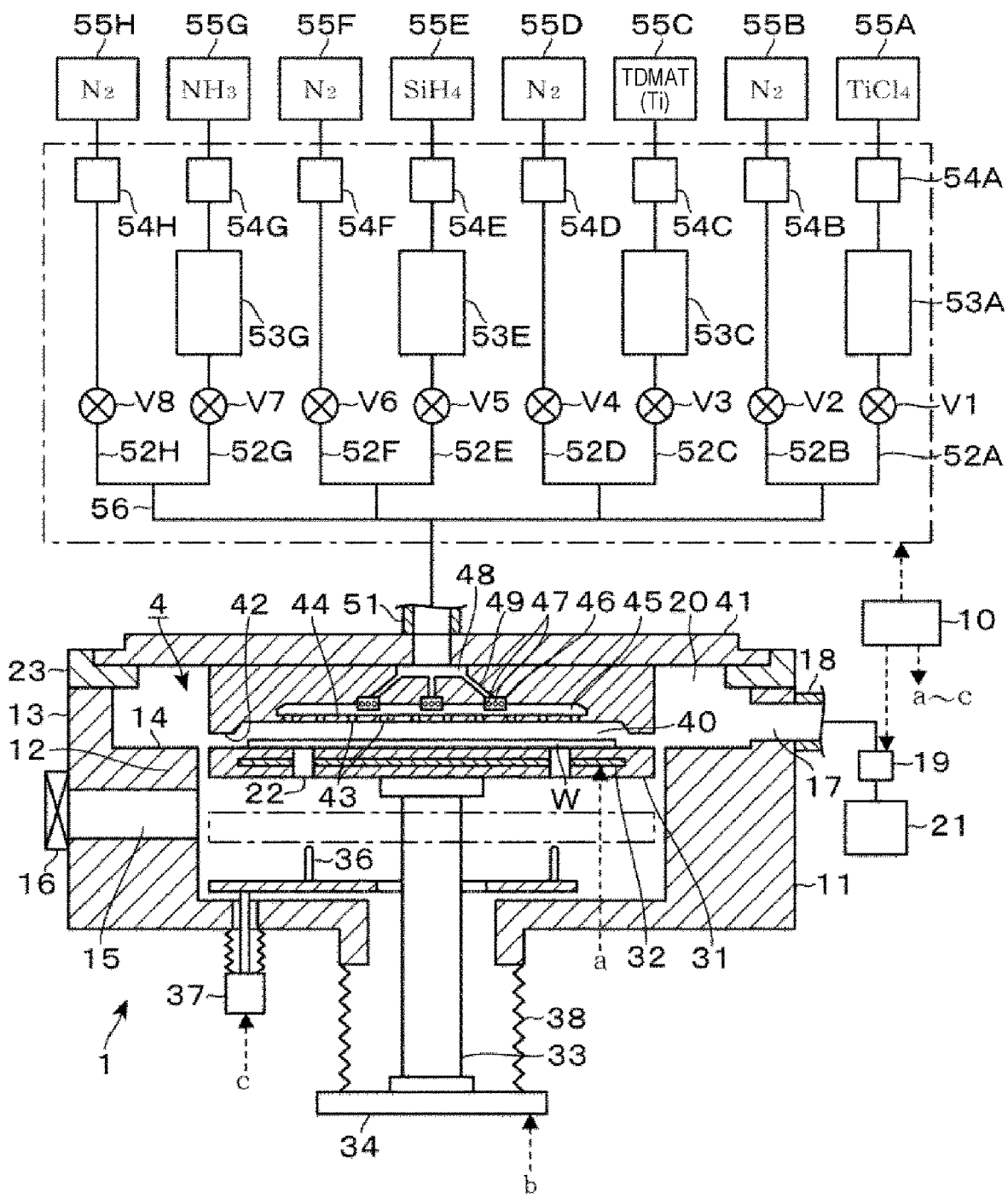
FIG. 1 is a longitudinal sectional side view of a film-forming apparatus according to a first embodiment of the present disclosure.
Figure 2:
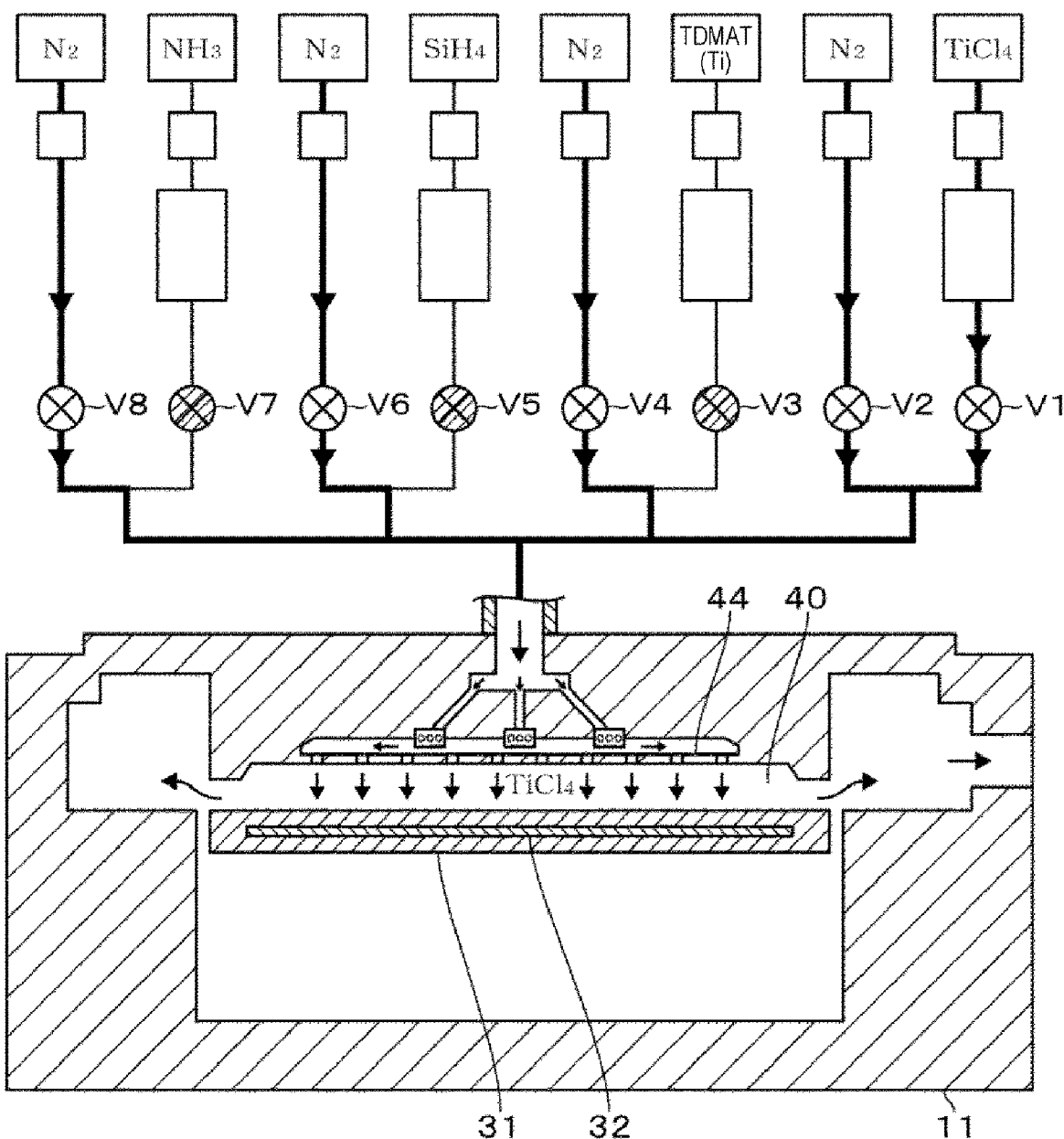
FIG. 2 is an explanatory view illustrating a pre-coating process in the film-forming apparatus.
Figure 3:
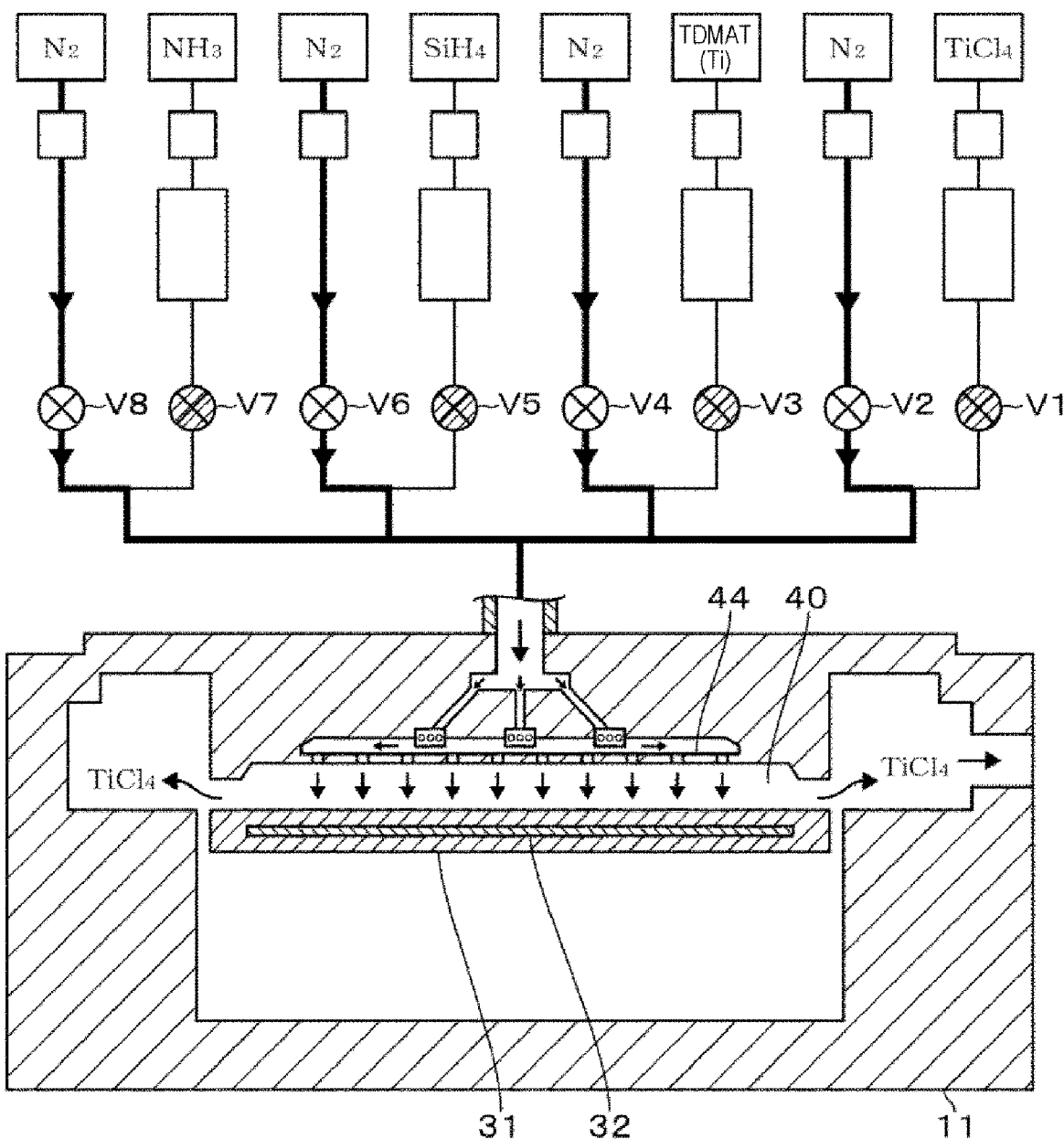
FIG. 3 is an explanatory view illustrating a pre-coating process in the film-forming apparatus.
Figure 4:
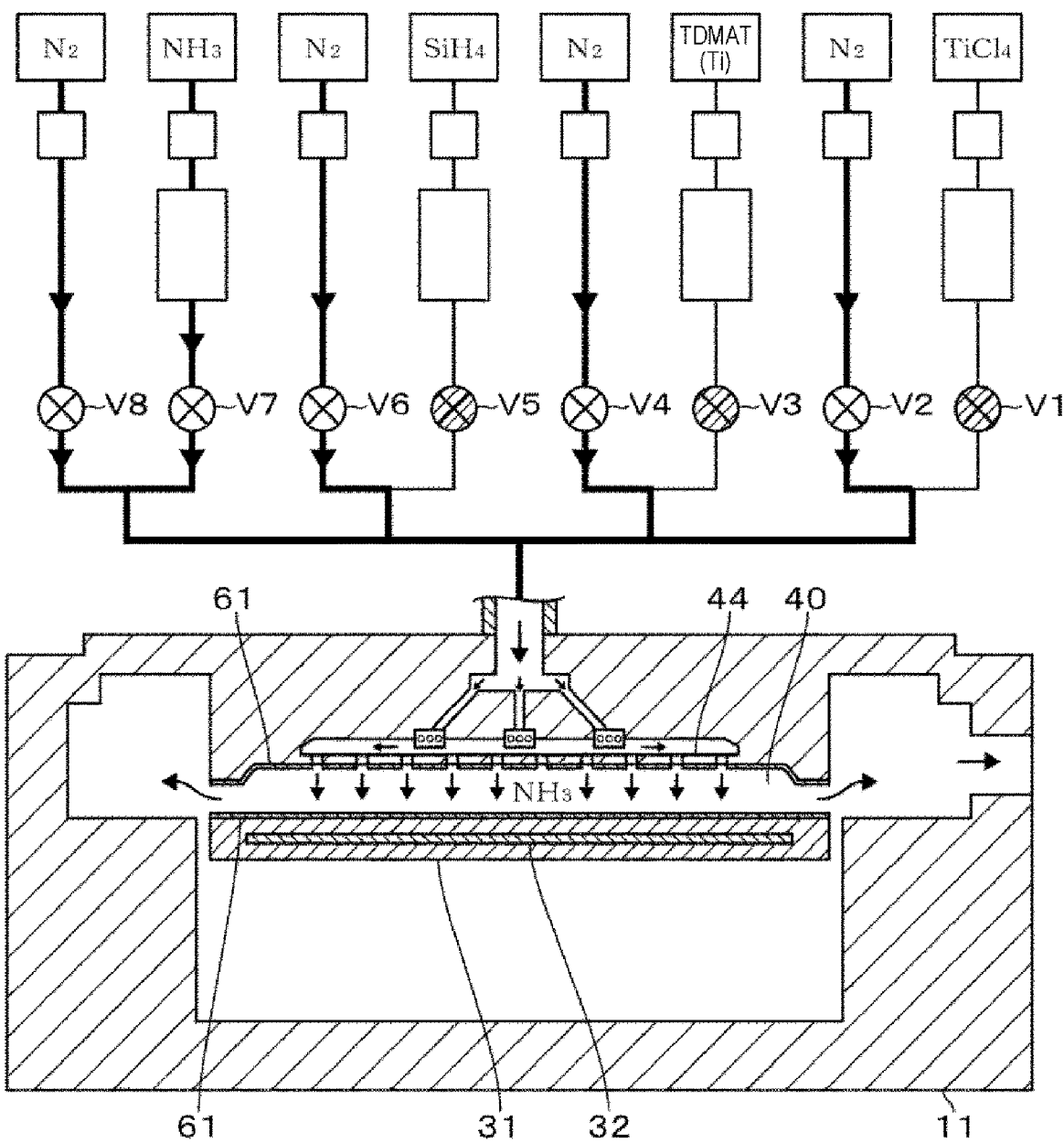
FIG. 4 is an explanatory view illustrating a pre-coating process in the film-forming apparatus.
Figure 5:
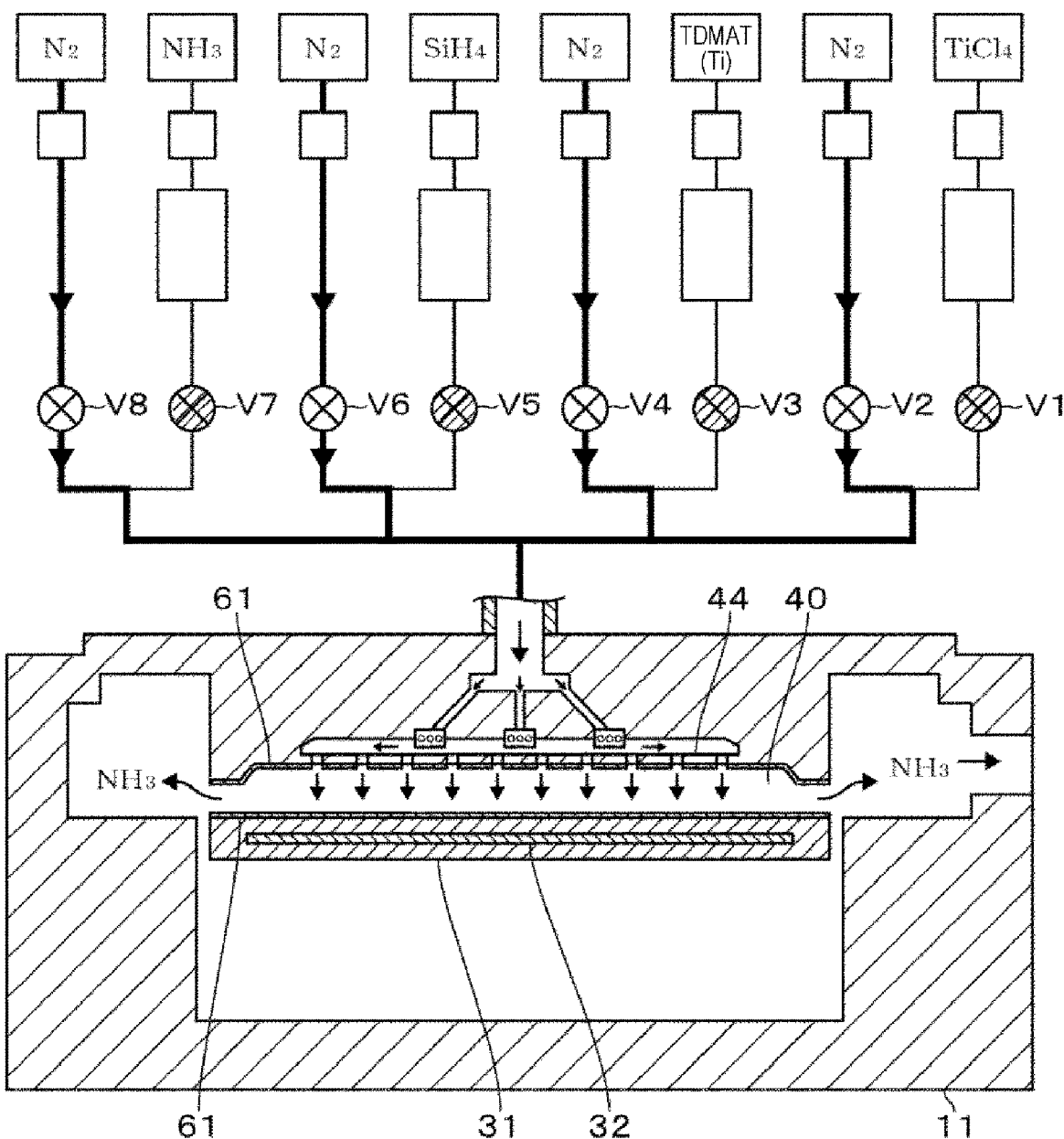
FIG. 5 is an explanatory view illustrating a pre-coating process in the film-forming apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

A film-forming apparatus 1 according to a first embodiment of the present disclosure will be described with reference to a longitudinal sectional side view of FIG. 1. The film-forming apparatus 1 includes a processing container 11 which is a vacuum container for accommodating and processing a wafer W, and forms a TiN film containing Si (hereinafter referred to as a TiSiN film) as a target film on the wafer W by ALD. Before the wafer W is loaded into the processing container 11, pre-coating is performed to form a pre-coating film on a surface of each member installed in the processing container 11. The pre-coating film is a laminated film of a TiN film as a lower film and an amorphous silicon (a-Si) film as an upper film. The TiN film and the a-Si film are formed in the processing container 11 by ALD. The TiN film constituting the pre-coating film is formed by using a TiCl$_4$ gas, namely a precursor containing an inorganic metal compound. The TiSiN film as the target film is formed by using a TDMAT gas, namely a precursor containing an organometallic compound. That is to say, the pre-coating film and the target film are formed by using different kinds of compounds containing titanium (Ti) in common.

The processing container 11 has a substantially flat circular shape. A heater (not shown) for heating the interior of the processing container to a desired temperature at the time of forming the pre-coating film and the target film is buried in a lateral wall of the processing container 11. A lower lateral wall 12 of the processing container 11 is formed so as to protrude toward the central portion in the processing container 11 when viewed from top as compared with an upper lateral wall 13 of the processing container 11. An upper surface of the protruded portion of the lower lateral wall 12 is configured as a ring-shaped horizontal surface 14. In FIG. 1, reference numeral 15 denotes a loading/unloading port formed in the lower lateral wall 12 and through which the wafer W is loaded/unloaded. Reference numeral 16 denotes a gate valve for opening and closing the loading/unloading port 15.

An exhaust port 17 is opened in the upper lateral wall 13 of the processing container 11. One end of an exhaust pipe 18 is connected to the exhaust port 17 and the other end thereof is connected to an exhaust mechanism 21 constituted by a vacuum pump via a pressure regulation mechanism 19 constituted by a valve and the like. The pressure regulation mechanism 19 regulates an internal pressure of the processing container 11 based on a control signal outputted from a control part 10 to be described later.

A circular mounting table 31 is installed so as to be surrounded by the lower lateral wall 12 in a state where a lateral surface of the circular mounting table 31 is close to the lower lateral wall 12. The wafer W is mounted on an upper surface of the mounting table 31 in a horizontal posture. A heater 32 for setting the interior of the processing container 11 to a desired temperature is buried in the mounting table 31. An upper end of a support member 33 extending vertically through the bottom of the processing container 11 is connected to a lower surface of the mounting table 31, and a lower end of the support member 33 is supported on an elevating table 34. With this configuration, the mounting table 31 moves up and down between a processing position (a position indicated by a solid line in FIG. 1) and a delivery position (a position indicated by a chain line in FIG. 1) below the processing position. When forming the pre-coating film and the target film, the mounting table 31 is located at the processing position. At the processing position, the upper surface of the mounting table 31 is located at approximately the same height as the horizontal surface 14 of the lower lateral wall 12 of the processing container 11. When the wafer W is delivered between the mounting table 31 and a transfer mechanism for the wafer W, which enters the processing container 11 through the loading/unloading port 15, the mounting table 31 is located at the delivery position.

In FIG. 1, reference numeral 36 denotes three support pins (only two shown in FIG. 1) and reference numeral 37 denotes an elevating mechanism for moving up and down the support pins 36. When the mounting table 31 is located at the delivery position, the support pins 36 are moved up/down via respective through-holes 22 formed in the mounting table 31 so that they are moved upward and downward on the upper surface of the mounting table 31. Thus, the wafer W is delivered between the mounting table 31 and the transfer mechanism. In the figure, reference numeral 38 denotes a vertically extendible bellows which surrounds a lower portion of the support member 33. An upper end of the bellows 38 is connected to the bottom of the processing container 11 and a lower end thereof is connected to the elevating table 34, so that the airtightness of the processing container 11 is secured.

A horizontal plate 41 is installed above the upper lateral wall 13 so as to close the processing container 11 from the top via a support member 23. The support member 23 is formed in a ring shape along the upper lateral wall 13 when viewed from the top. A circular gas supply part 4 is installed in a central portion of a lower surface of the horizontal plate 41 to face the mounting table 31. A peripheral portion of the lower surface of the gas supply part 4 forms an annular projection 42 that projects downward. When the mounting table 31 is located at the processing position, the annular projection 42 is close to the peripheral portion of the mounting table 31. When the mounting table 31 is located at the processing position, a space defined between the lower surface of the gas supply part 4 and the upper surface of the mounting table 31 inward of the annular projection 42 when viewed from the top forms a flat circular processing space 40. The wafer W is accommodated in the processing space 40 where the wafer W is subjected to a film forming process. An annular exhaust region 20 is defined above the horizontal surface 14 so as to laterally surround the processing space 40. The exhaust region 20 is exhausted through the exhaust port 17. By exhausting the exhaust region 20 in this way, the processing space 40 is exhausted in the overall lateral direction via a gap between the mounting table 31 and the annular projection 42.

A number of gas discharge holes 43 are formed in the lower surface of the gas supply part 4 surrounded by the annular projection 42 so as to be formed vertically and be opened dispersedly. A gas is discharged in the form of a shower to the wafer W through the gas discharge holes 43. Thus, the lower surface portion of the gas supply part 4 surrounded by the annular projection 42 is configured as a gas shower head 44. The gas supply part 4 has a flat circular diffusion space 45 to which upper ends of the gas discharge holes 43 are connected. A plurality of circular gas diffusion parts 46 are dispersedly installed in a ceiling forming the diffusion space 45. A large number of gas supply holes 47 are horizontally opened in lateral surfaces of the gas diffusion parts 46 at intervals along the circumferential direction. A flat gas introduction passage 48 is formed in an upper portion of the gas supply part 4. Elongated branch paths 49 extend downward from the gas introduction passage 48 to be connected to the gas diffusion parts 46, respectively. With this configuration, a gas supplied to the gas introduction passage 48 is horizontally discharged from each of the gas diffusion parts 46 to the diffusion space 45, diffuses inside the diffusion space 45, and subsequently is discharged from the gas shower head 44 into the entire region of the processing space 40.

A gas supply passage 51 for supplying a gas to the gas introduction passage 48 via a flow path formed in the horizontal plate 41 is connected to the horizontal plate 41. An upstream side of the gas supply passage 51 is branched into four paths which form branch flow paths 56. Each of upstream sides of the four branch flow paths 56 is further branched into two flow paths, thus forming flow paths 52A to 52H in total. The flow paths 52A and 52B are paired, the flow paths 52C and 52D are paired, the flow paths 52E and 52F are paired, and the flow paths 52G and 52H are paired. One of the paired flow paths is a flow path of a nitrogen ($N_2$) gas serving as a carrier gas for a gas supplied to the other flow path.

An upstream side of the flow path 52A is coupled to a $TiCl_4$ gas supply source 55A via a valve V1, a tank 53A and a mass flow controller (MFC) 54A in the named order. The tank 53A temporarily stores a $TiCl_4$ gas before it is supplied into the processing container 11. More specifically, when the valve V1 remains closed, the $TiCl_4$ gas is supplied from the $TiCl_4$ gas supply source 55A into the tank 53A so that an internal pressure of the tank 53A is increased. In a state where the internal pressure remains increased, the valve V1 is opened and the $TiCl_4$ gas is supplied into the processing container 11 at a relatively high flow rate. Similar to the tank 53A, the other tanks to be described later also store gases supplied from upstream sides thereof in a state where respective valves installed at downstream sides thereof remain closed, and supply the stored gases into the processing container 11 at a relatively high flow rate. An upstream side of the flow path 52B is coupled to a $N_2$ gas supply source 55B via a valve V2 and an MFC 54B in the named order.

An upstream side of the flow path 52C is coupled to a TDMAT gas supply source 55C via a valve V3, a tank 53C and an MFC 54C in the named order. The TDMAT gas supply source 55C swerving as a second gas supply part includes a raw material container for storing and heating liquid TDMAT, and a $N_2$ gas supply source for supplying a $N_2$ gas as a carrier gas into the raw material container. TDMAT (TDMAT gas) vaporized by supplying the carrier gas is supplied to the flow path 52C together with the carrier gas. That is to say, a gas supplied to the downstream side of the TDMAT gas supply source 55C is a mixed gas of the TDMAT gas and the $N_2$ gas. For the sake of convenience in description, the mixed gas is referred to as the TDMAT gas. The $TiCl_4$ gas supply source 55A is configured so as to generate the $TiCl_4$ gas by heating and vaporizing liquid $TiCl_4$ without depending on a carrier gas. The $TiCl_4$ gas thus generated is supplied to the flow path 52A by virtue of a vapor pressure of the $TiCl_4$ gas itself. Further, an upstream side of the flow path 52D is coupled to a nitrogen ($N_2$) gas supply source 55D via a valve V4 and an MFC 54D in the named order.

An upstream side of the flow path 52E is coupled to a monosilane ($SiH_4$) gas supply source 55E serving as a first gas supply part via a valve V5, a tank 53E and an MFC 54E in the named order. An upstream side of the flow path 52F is coupled to a nitrogen ($N_2$) gas supply source 55F via a valve V6 and an MFC 54F in the named order. An upstream side of the flow path 52G is coupled to an ammonia ($NH_3$) gas supply source 55G via a valve V7, a tank 53G and an MFC 54G in the named order. An upstream side of the flow path 52H is coupled to a $N_2$ gas supply source 55H via a valve V8 and an MFC 54H in the named order. As described above, the $N_2$ gas supplied from each of the $N_2$ gas supply sources 55B, 55D, 55F and 55H is a carrier gas. The $N_2$ gas also acts as a purge gas for purging a gas remaining in the processing container 11 by being always supplied into the processing container 11 during the film forming process.

The film-forming apparatus 1 includes a control part 10. The control part 10 is constituted by a computer and includes a program, a memory and a CPU. The program incorporates a group of steps to allow the film-forming apparatus 1 to perform a series of operations to be described later. The control part 10 outputs a control signal to respective parts of the film-forming apparatus 1 according to the program to control the operation of the respective parts. Specifically, various operations such as opening/closing of the valves V1 to V8, adjustment of gas flow rates performed by the MFCs 54A to 54H, regulation of the internal pressure of the processing container 11 performed by the pressure regulation mechanism 19, adjustment of the internal temperature of the processing container 11 performed by the heater 32 and the heater installed in the processing container 11, the vertical movement of the mounting table 31, and the vertical movement of the support pins 36 are controlled by the respective control signals. The above program is stored in a storage medium such as a compact disk, a hard disk, a magneto-optical disk, a DVD or the like, and is installed on the control part 10.

Figure 13:
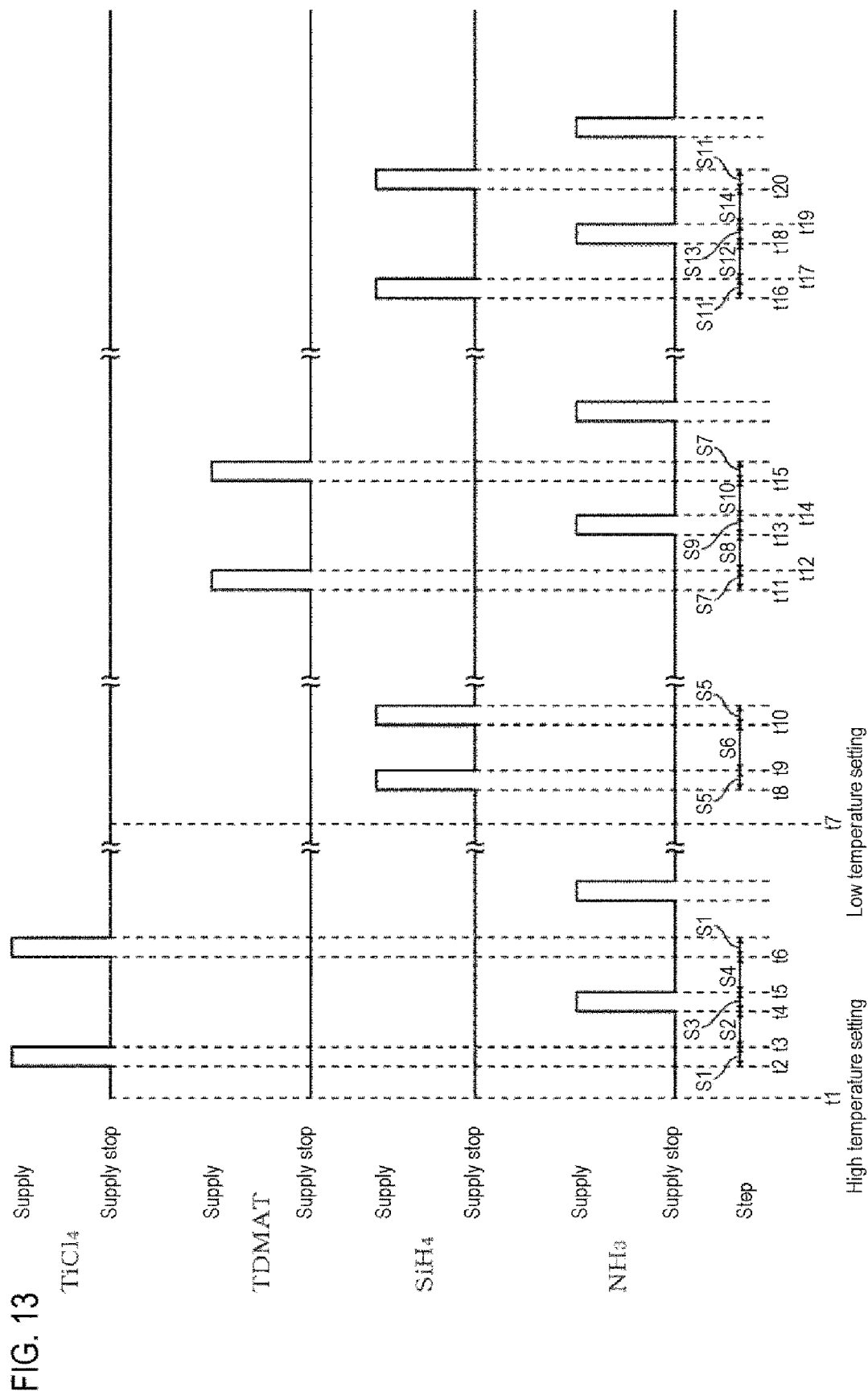
FIG. 13 is a timing chart illustrating timings at which various gases are supplied into a processing container included in the film-forming apparatus.
Figure 14:
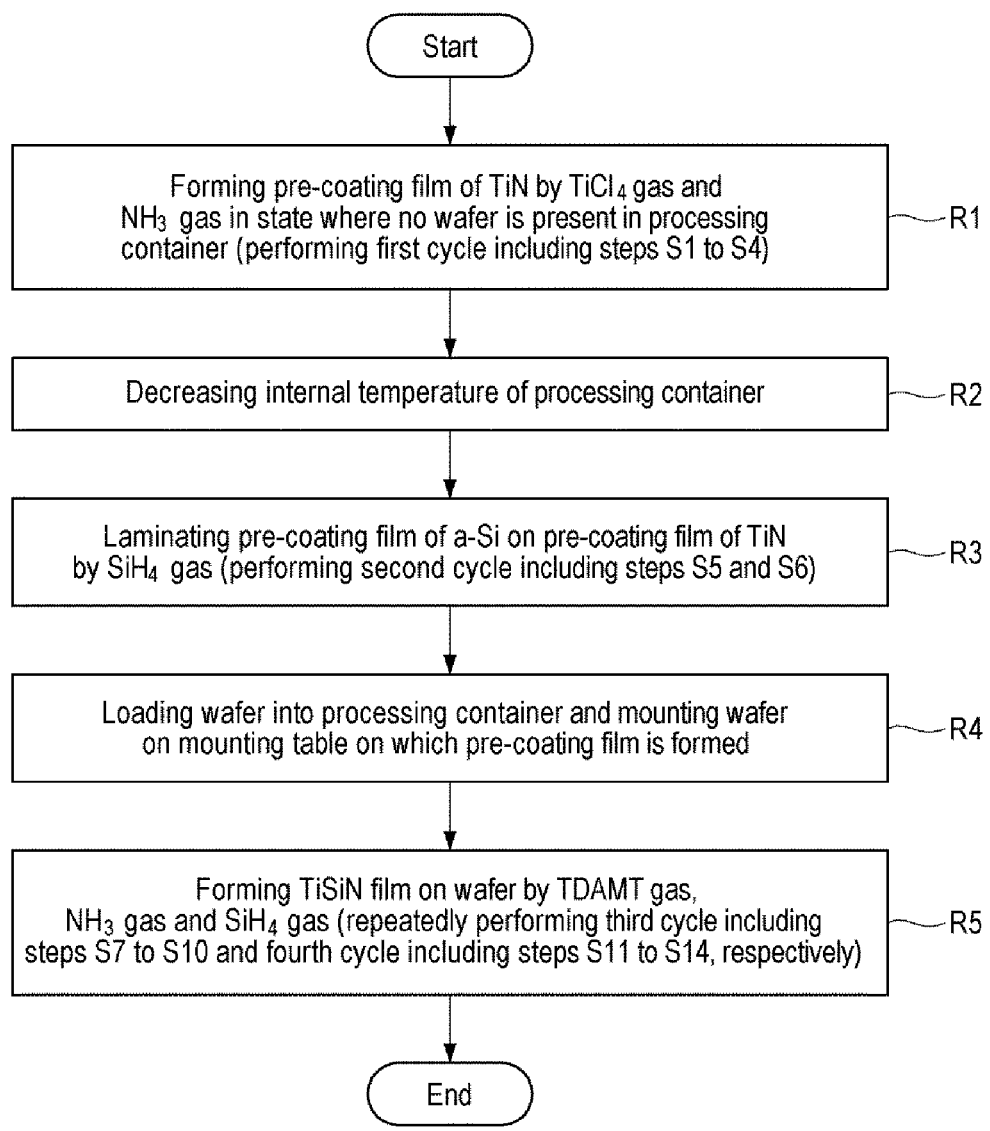
FIG. 14 is a chart diagram illustrating a flow of processing in the film-forming apparatus.

Next, the pre-coating process and the process of forming the target film in the film-forming apparatus 1 will be described with reference to FIGS. 2 to 12. In FIGS. 2 to 12, a flow of gas in the processing container 11 is indicated by an arrow, and closed valves V are hatched to distinguish them from opened valves V. In addition, in each gas flow passage, the flow of gas is indicated by showing a portion through which a gas flows toward the downstream side as thicker than other portions through which no gas flows. The $TiCl_4$ gas, the TDMAT gas, the $SiH_4$ gas and the $NH_3$ gas are supplied from the respective gas supply sources to the respective tanks and temporarily stored therein before being supplied into the processing container 11. It should be noted that the flow of gases from the respective gas supply sources toward the respective tanks is not indicated as such a thick flow path. FIG. 13 is a timing chart showing periods of time during which the $TiCl_4$ gas as a fourth gas, the TDMAT gas as a second gas, the $SiH_4$ gas as a first gas and the $NH_3$ gas as a third gas are supplied into the processing container 11, respectively, and FIG. 13 is referred to, as appropriate. The timing chart also shows periods of time during which various steps to be described later are performed. FIG. 14 is a flow chart illustrating the procedure of a series of processes performed by the film-forming apparatus 1, and is also referred to, as appropriate. Columns illustrating the various steps in this flow chart are denoted by reference symbols R1 to R5 in order to distinguish them from steps S1 to S14 shown in the timing chart of FIG. 13.

First, the valves V1 to V8 are closed and the mounting table 31 is located at the processing position in a state where a pre-coating film is not formed and a wafer W is not mounted on the mounting table 31, thereby forming the processing space 40. The interior of the processing container 11 is exhausted to be in a vacuum atmosphere of a predetermined pressure. The valves V2, V4, V6 and V8 are opened to supply the $N_2$ gas from the gas shower head 44 into the processing space 40, and the internal temperature of the processing container 11 is increased to, for example, 400 degrees C. or more, 700 degrees C. or less, specifically, for example, 460 degrees C., by the heater 32 and the heater installed in the lateral wall of the processing container 11 (time t1 in the timing chart).

Thereafter, the valve V1 is opened to supply the $TiCl_4$ gas from the gas shower head 44 into the processing space 40 (time t2). The $TiCl_4$ gas is adsorbed onto the surface of the gas shower head 44 forming the processing space 40 and the upper surface of the mounting table 31 (step S1 in FIG. 2). Subsequently, the valve V1 is closed (time t3) to stop the supply of the $TiCl_4$ gas from the gas shower head 44. The $TiCl_4$ gas remaining in the processing container 11 is purged and removed by the $N_2$ gas (step S2 in FIG. 3). Thereafter, the valve V7 is opened (time t4) to supply the $NH_3$ gas from the gas shower head 44 into the processing space 40. The $NH_3$ gas reacts with the $TiCl_4$ adsorbed on the surface of the gas shower head 44 forming the processing space 40 and the upper surface of the mounting table 31 to form a TiN film 61 which is an underlying film of the pre-coating film (step S3 in FIG. 4). Subsequently, the valve V7 is closed (time t5) to stop the supply of the $NH_3$ gas from the gas shower head 44. The $NH_3$ gas remaining in the processing container 11 is purged and removed by the $N_2$ gas (step S4 in FIG. 5).

Thereafter, the valve V1 is opened (time t6) to supply the $TiCl_4$ gas into the processing space 40. That is to say, the above step S1 is performed again. After the step S1 is performed, the above steps S2 to S4 are performed and subsequently, the steps S1 to S4 are further performed. That is to say, assuming that a sequence of steps S1 to S4 is referred to as a first cycle, the first cycle is repeatedly performed to increase a thickness of the TiN film 61.

The first cycle is performed a predetermined number of times, for example 12,000 times, so that the TiN film 61 has a desired film thickness. Thereafter, the valves V2, V4, V6 and V8 among the valves V1 to V8 are opened to supply only the $N_2$ gas into the processing space 40. The above step of forming the TiN film 61 is represented as step R1 in the flow chart. Then, the internal temperature of the processing container 11 is decreased to, for example, 150 to 300 degrees C., more specifically, for example, 200 degrees C. (time t7, step R2). Thereafter, the valve V5 is opened to supply the $SiH_4$ gas from the gas shower head 44 into the processing space 40 (time t8). The $SiH_4$ gas is adsorbed on the surface of the TiN film 61. Although the internal temperature of the processing container 11 is relatively low as described above, since TiN serves as a catalyst, the $SiH_4$ gas adsorbed on the TiN film 61 is decomposed even at such a temperature. Thus, an a-Si film 62 as the pre-coating film is formed (step S5 in FIG. 6). That is to say, the a-Si film 62 as an upper-lying film is formed so as to be laminated on the TiN film 61. For example, after 0.05 seconds from time t8, the valve V5 is closed (time t9) to stop the supply of the $SiH_4$ gas from the gas shower head 44. The $SiH_4$ gas remaining in the processing container 11 is purged and removed by the $N_2$ gas (step S6 in FIG. 7).

For example, after 0.2 seconds from time t9, the valve V5 is opened (time t10) to supply the $SiH_4$ gas into the processing space 40. That is to say, the above step S5 is performed again. After the step S5 is performed, the above step S6 is performed and thereafter, the steps S5 and S6 are further performed. That is to say, assuming that a sequence of steps S5 and S6 is referred to as a second cycle, the second cycle is repeatedly performed to increase the thickness of the a-Si film 62. When the second cycle is repeatedly performed a predetermined number of times, for example, 10 to 200 times, for example, the valves V1 to V8 are closed and the pre-coating is terminated. The above step of forming the a-Si film 62 is represented as step R3 in the flow chart.

Figure 15:
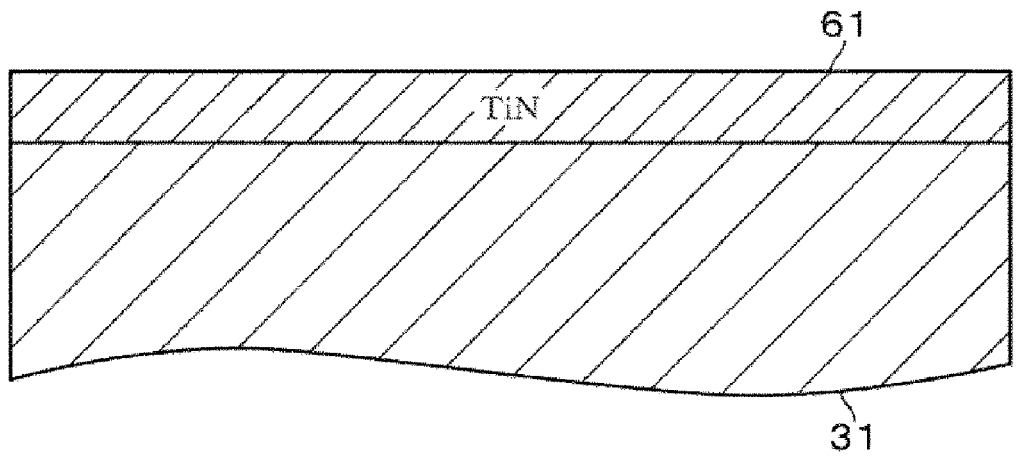
FIG. 15 is a schematic view illustrating the state of a mounting table included in the film-forming apparatus.
Figure 16:
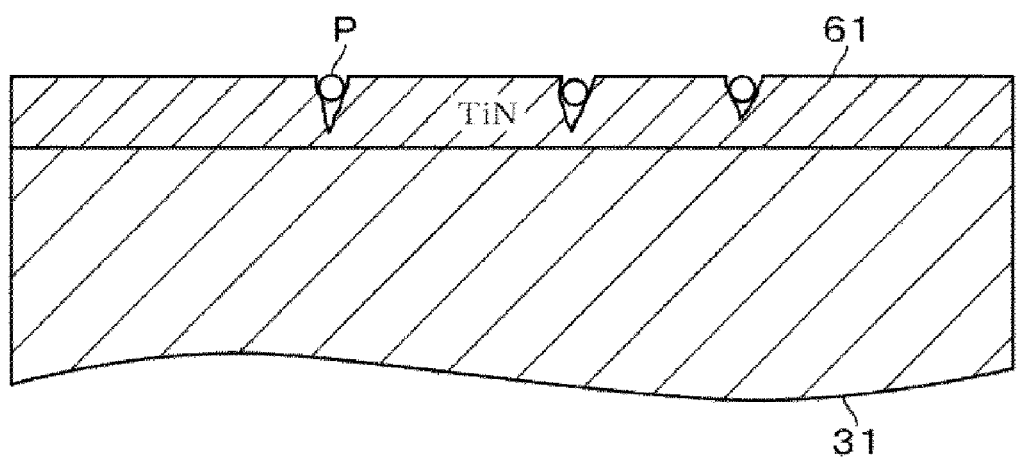
FIG. 16 is a schematic view illustrating the state of a mounting table included in the film-forming apparatus.
Figure 17:
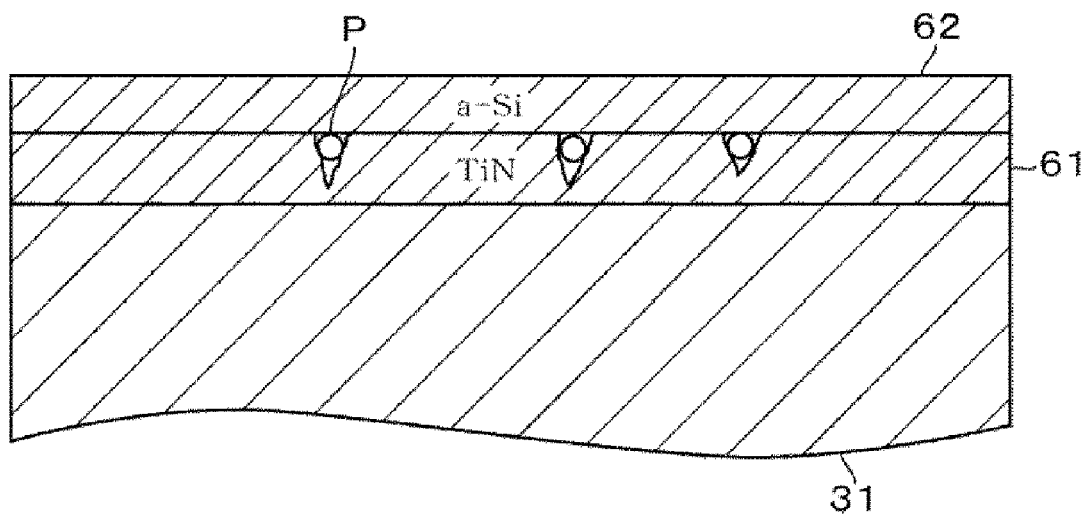
FIG. 17 is a schematic view illustrating the state of a mounting table included in the film-forming apparatus.

The reason for laminating the a-Si film 62 on the TiN film 61 in this manner will be described with reference to FIGS. 15 to 17 which are schematic views of the mounting table 31. In order to react the $TiCl_4$ gas and the $NH_3$ gas with each other in the sequence of steps S1 to S4 (the first cycle) described in FIGS. 2 to 5 to form the TiN film 61, there is a need to set the interior of the processing container 11 to have a relatively high temperature. However, when a TiSiN film is subsequently formed on the wafer W, instead of $TiCl_4$, TDMAT not containing chlorine as a constituent element is used as a precursor. This is to prevent chlorine as an impurity from entering the target film formed on the wafer W, as described in the BACKGROUND section of the present disclosure. It should be noted that the phrase "not containing chlorine as a constituent element" does not mean that it excludes not containing chlorine which may be unavoidably mixed as an impurity.

A decomposition temperature of the organometallic compound is relatively low and accordingly a decomposition temperature of the above-mentioned TDMAT is also relatively low. Therefore, in order to prevent the TDMAT from being decomposed before being adsorbed on the wafer W, the internal temperature of the processing container 11 is decreased after the TiN film 61 is formed as described above. FIG. 15 illustrates the mounting table 31 immediately after the formation of the TiN film 61 is completed and before the internal temperature of the processing container 11 is decreased. FIG. 16 illustrates the mounting table 31 after the internal temperature of the processing container 11 is decreased. From the results of Evaluation test to be described later, it is considered that cracks occur in the TiN film 61 due to the decrease in the internal temperature and particles P, consisting of atoms or molecules composed of TiN, Ti not nitrided, and Ti of $TiO_2$ which is a Ti oxide, are generated as illustrated in FIG. 16.

Figure 6:
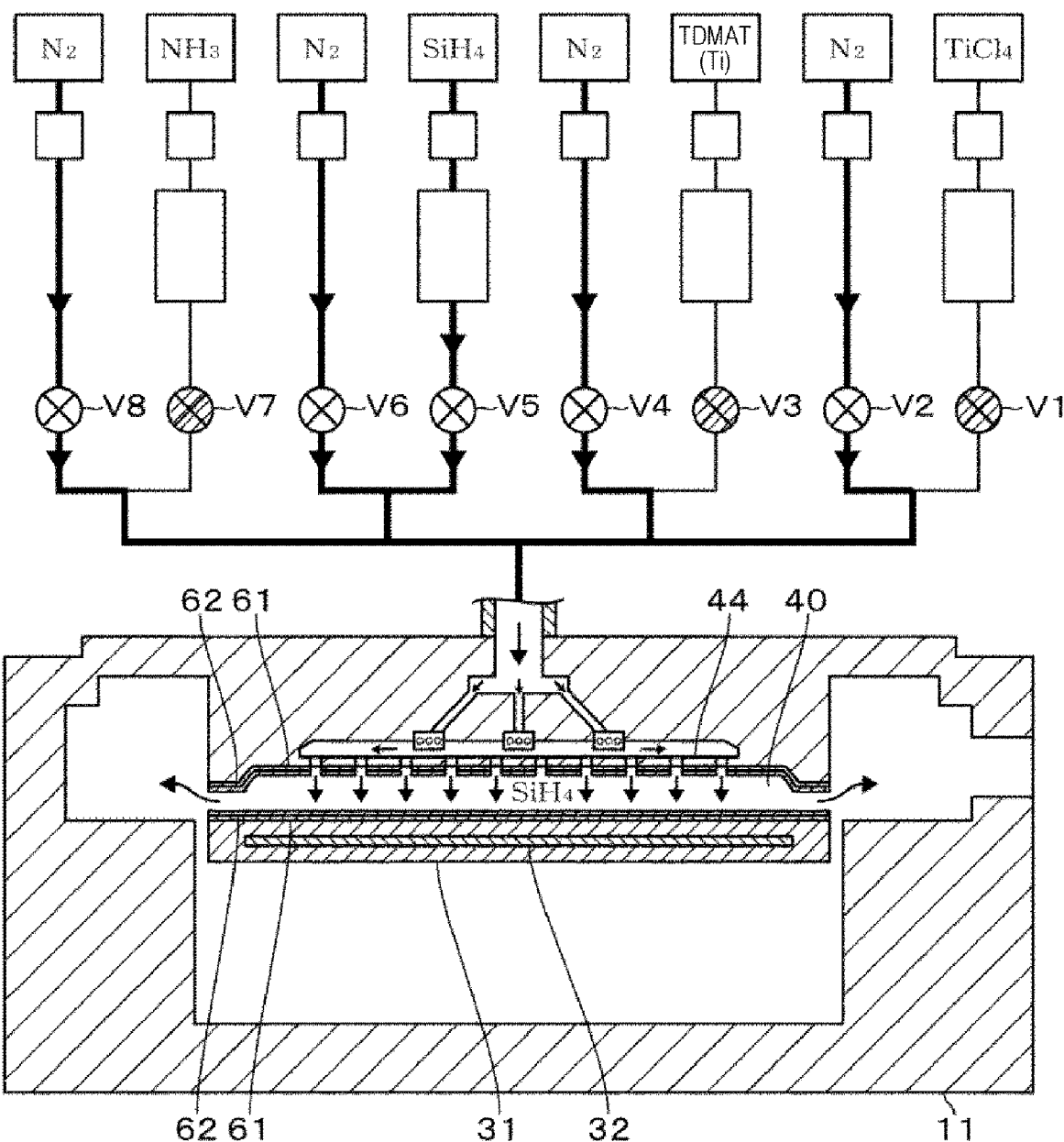
FIG. 6 is an explanatory view illustrating a pre-coating process in the film-forming apparatus.
Figure 7:
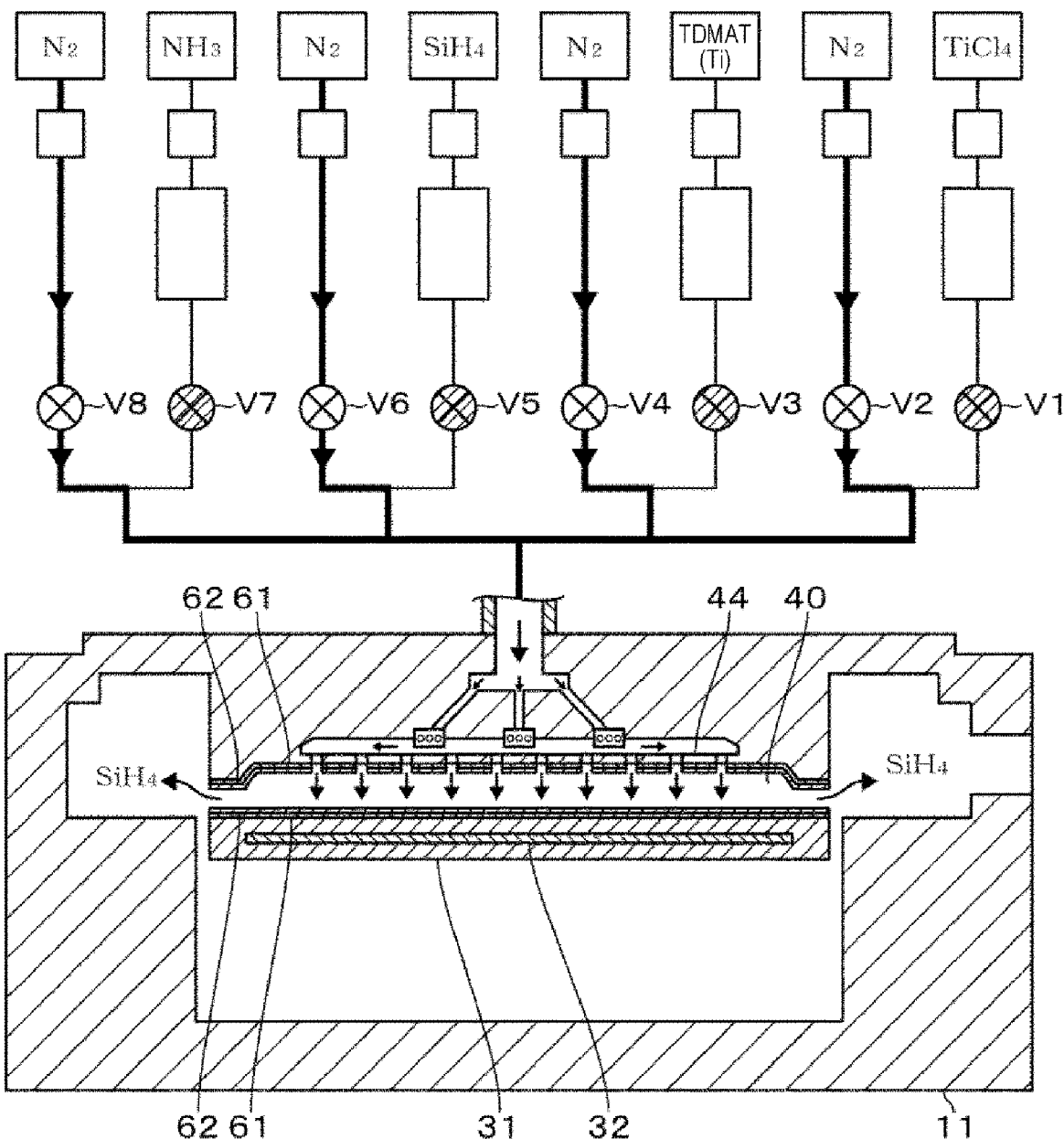
FIG. 7 is an explanatory view illustrating a pre-coating process in the film-forming apparatus.
Figure 8:
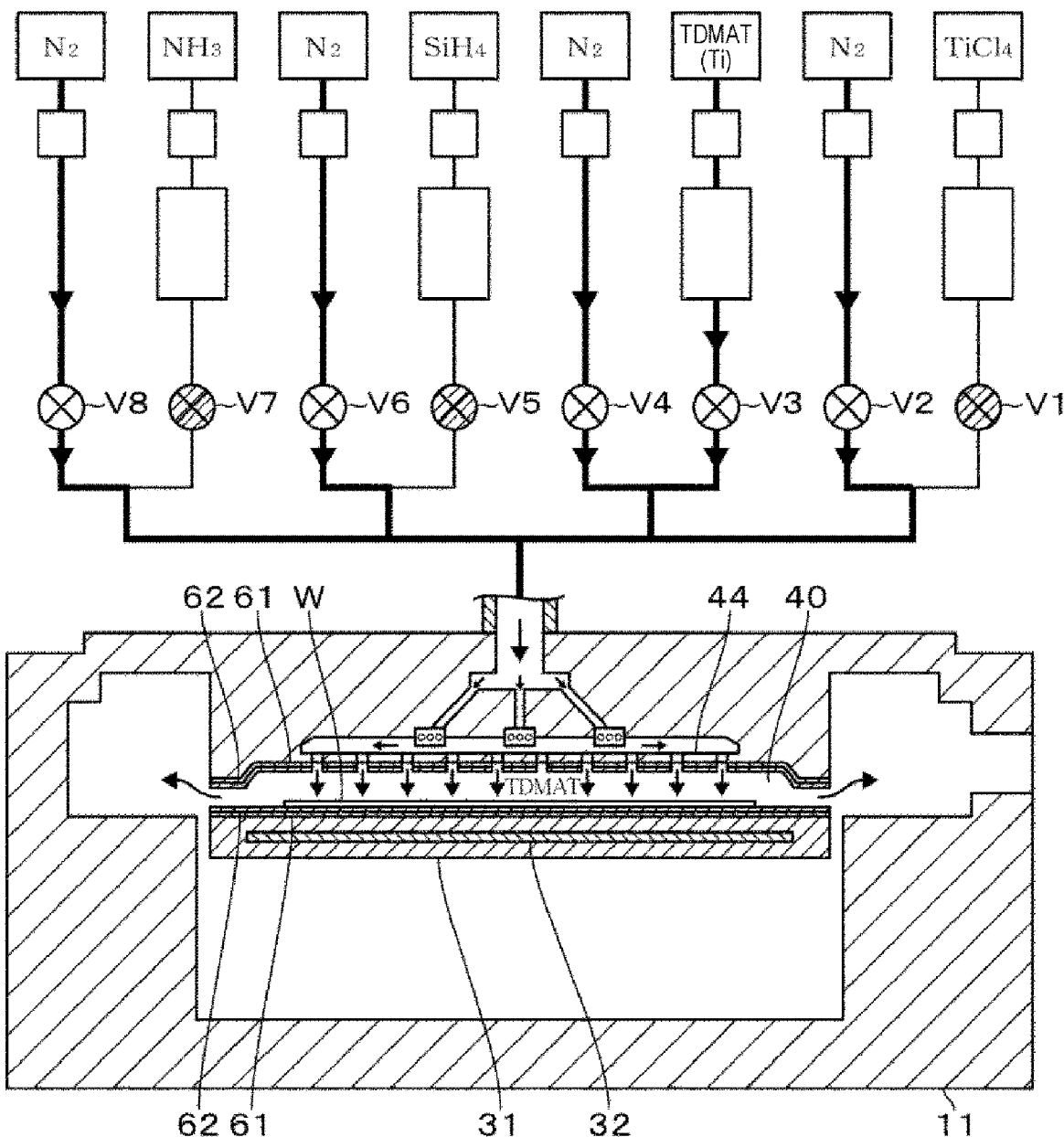
FIG. 8 is an explanatory view illustrating a film forming process performed on a wafer in the film-forming apparatus.
Figure 9:
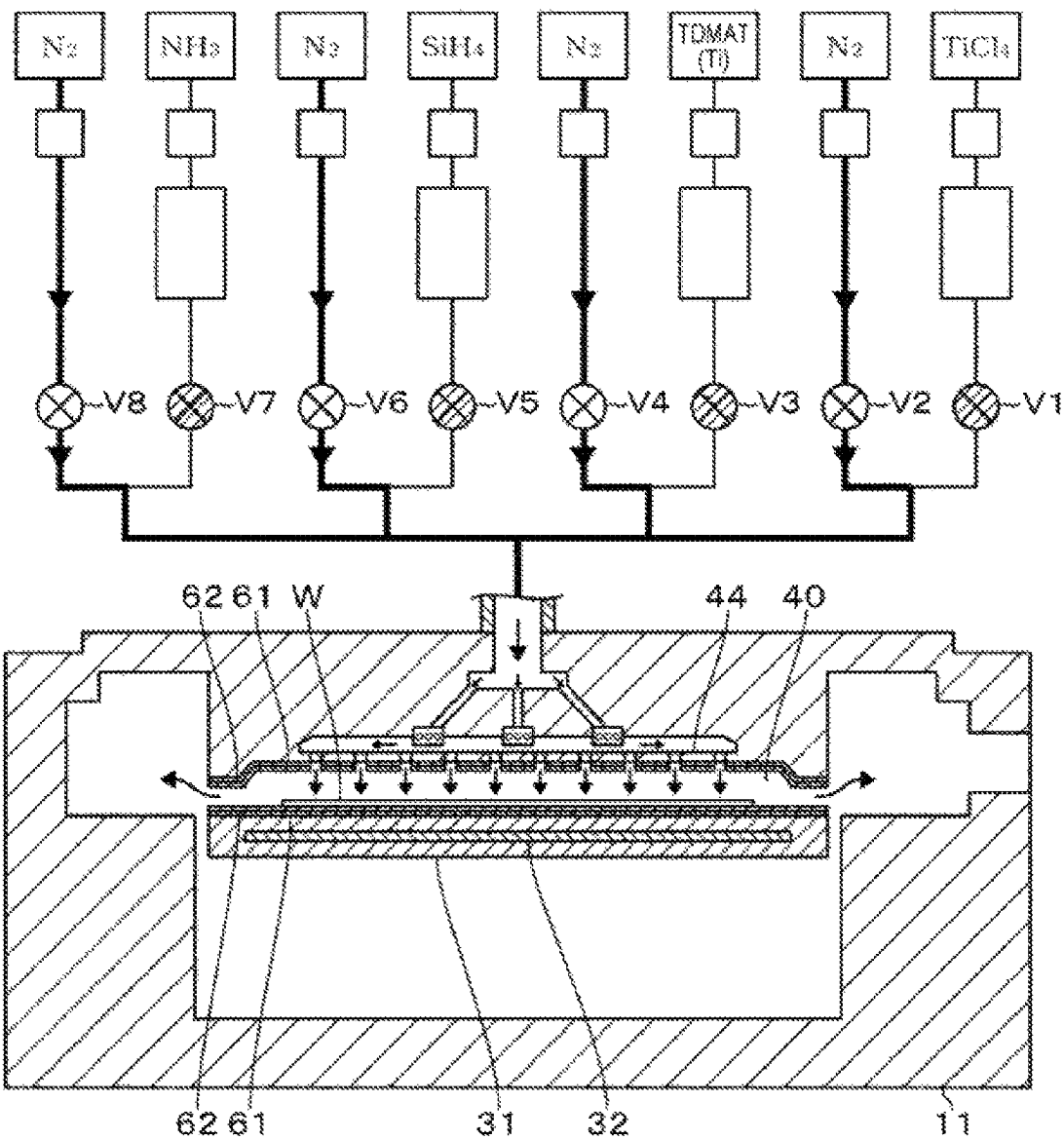
FIG. 9 is an explanatory view illustrating a film forming process performed on a wafer in the film-forming apparatus.
Figure 10:
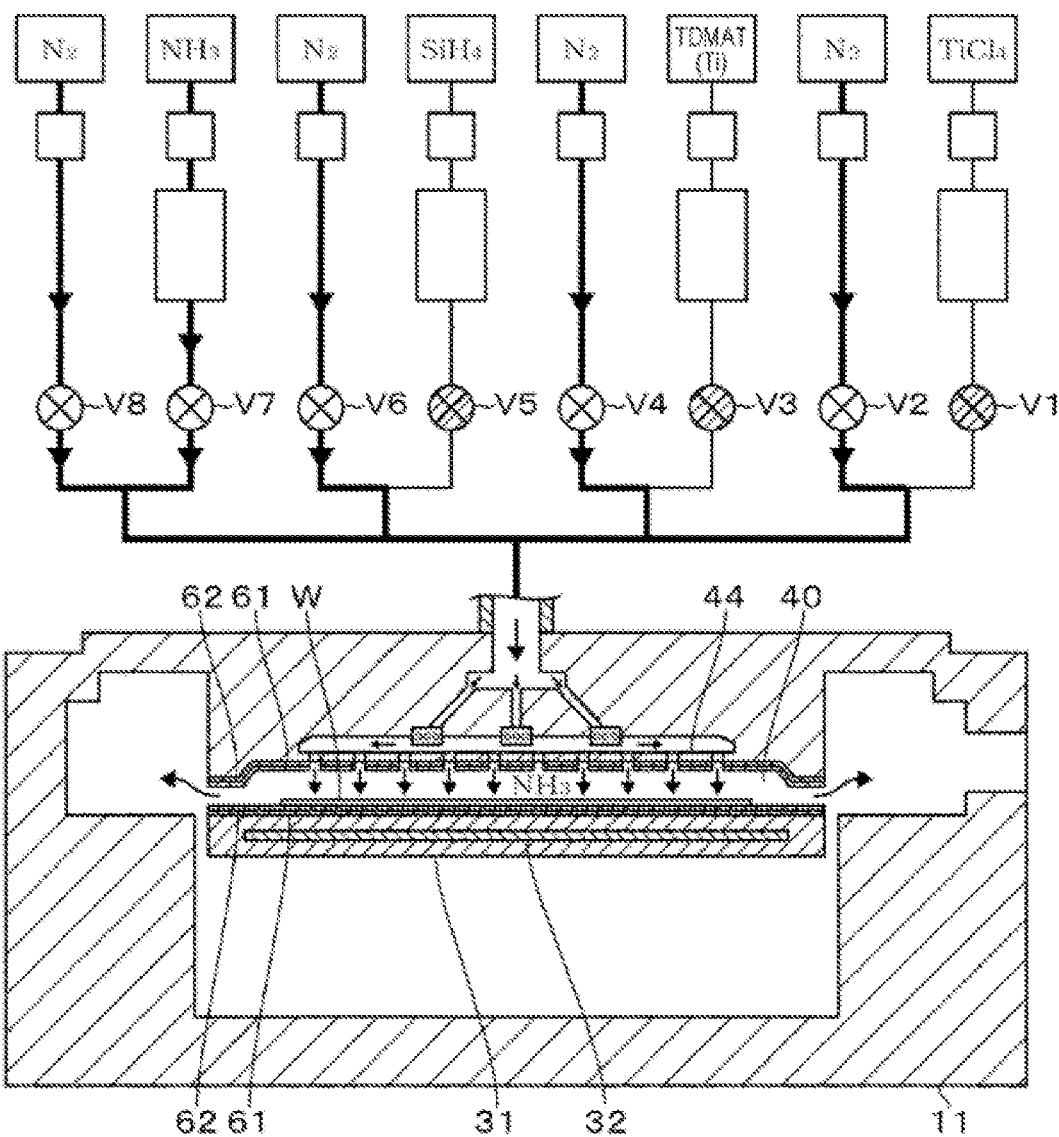
FIG. 10 is an explanatory view illustrating a film forming process performed on a wafer in the film-forming apparatus.
Figure 11:
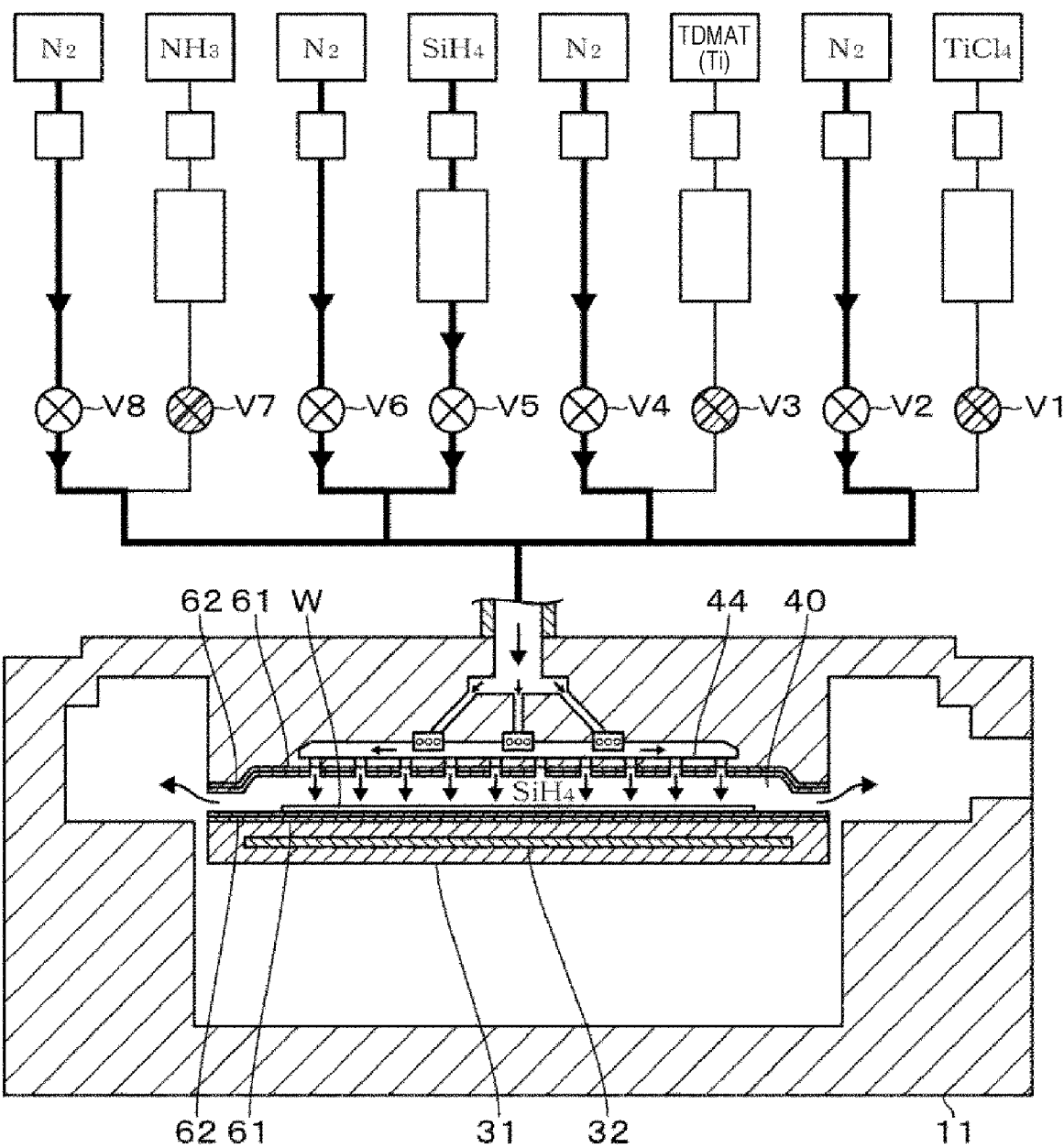
FIG. 11 is an explanatory view illustrating a film forming process performed on a wafer in the film-forming apparatus.

In the state where the particles P are generated thus, when the wafer W is mounted on the mounting table 31 in order to form a film, the particles P adhere to a back surface of the wafer W, contaminating the back surface of the wafer W. Therefore, the sequence of steps S5 and S6 (the second cycle) described in FIGS. 6 and 7 are performed to coat the a-Si film 62, which can be formed at a relatively low temperature due to the catalytic effect of the TiN film 61, on the TiN film 61 so as to prevent the particles P from scattering from the TiN film 61 and contacting with the wafer W. This prevents the back surface of the wafer W from being contaminated. FIG. 17 illustrates the mounting table 31 on which the a-Si film 62 is formed in this way.

Subsequently, a film forming process on the wafer W performed after the completion of the pre-coating will be described. For example, with the interior of the processing container 11 set to the temperature at the time of forming the a-Si film 62, the mounting table 31 on which the TiN film 61 and the a-Si film 62 are formed is lowered to the delivery position, as described previously. Then, the gate valve 16 is opened and the wafer W is transferred into the processing container 11 by the transfer mechanism and is mounted on the mounting table 31 (step R4). Therefore, the wafer W is mounted so that its back surface is brought into contact with the a-Si film 62 formed on the mounting table 31. When the transfer mechanism is withdrawn from the processing container 11 and the gate valve 16 is closed, the mounting table 31 is raised up to the processing position to form the processing space 40, the interior of the processing container 11 turns to a vacuum atmosphere of a predetermined pressure, and the wafer W is heated to have the same temperature as the interior of the processing container 11. Accordingly, the wafer W is heated to, for example, 150 degrees C. to 300 degrees C.

Subsequently, the valves V2, V4, V6 and V8 are opened to supply the $N_2$ gas from the gas shower head 44 into the processing space 40. Thereafter, the valve V3 is opened to supply the TDMAT gas from the gas shower head 44 into the processing space 40 (time t11). The TDMAT gas is adsorbed on the wafer W (step S7 in FIG. 8). Subsequently, the valve V3 is closed (time t12) to stop the discharge of the TDMAT gas from the gas shower head 44. The TDMAT gas remaining in the processing container 11 is purged and removed by the $N_2$ gas (step S8 in FIG. 9). Thereafter, the valve V7 is opened (time t13) to supply the $NH_3$ gas from the gas shower head 44 into the processing space 40. The $NH_3$ gas reacts with the TDMAT gas adsorbed on the surface of the wafer W to form a thin layer (not shown) of the TiN film (step S9 in FIG. 10). Subsequently, the valve V7 is closed (time t14) to stop the supply of the $NH_3$ gas from the gas shower head 44. The $NH_3$ gas remaining in the processing container 11 is purged and removed by the $N_2$ gas (step S10 in FIG. 9).

Thereafter, the valve V3 is opened (time t15) to supply the TDMAT gas onto the wafer W. That is to say, the above step S7 is performed again. After the step S7 is performed, the sequence of steps S8 to S10 are performed and thereafter, a sequence of steps S7 to S10 are further performed. That is to say, assuming that the sequence of steps S7 to S10 is referred to as a third cycle, the third cycle is repeatedly performed.

Thereafter, the valve V5 is opened to supply the $SiH_4$ gas from the gas shower head 44 into the processing space 40 (time t16). The $SiH_4$ gas is adsorbed on the TiN film of the surface of the wafer W and is decomposed to form a thin layer of the a-Si film (step S11 in FIG. 11). Illustration of this thin layer and a thin layer of SiN to be described below is omitted. Subsequently, the valve V5 is closed (time t17) to stop the discharge of the $SiH_4$ gas from the gas shower head 44. The $SiH_4$ gas remaining in the processing container 11 is purged and removed by the $N_2$ gas (step S12 in FIG. 9). Thereafter, the valve V7 is opened (time t18) to supply the $NH_3$ gas from the gas shower head 44 into the processing space 40. The $NH_3$ gas reacts with the a-Si film formed on the wafer W to form a thin layer of a silicon nitride (SiN) film (step S13 in FIG. 10).

Subsequently, the valve V7 is closed (time t19) to stop the supply of the $NH_3$ gas from the gas shower head 44. The $NH_3$ gas remaining in the processing container 11 is purged and removed by the $N_2$ gas (step S14 in FIG. 9). Assuming that a sequence of steps S11 to S14 is referred to as a fourth cycle, the fourth cycle is also repeatedly performed in the same manner as the above-described first to third cycles. Then, after the fourth cycle is repeatedly performed, the third cycle (the sequence of steps S7 to S10) is repeatedly performed a predetermined number of times and thereafter, the fourth cycle is again repeatedly performed. By alternately performing the repetition of the third cycle and the repetition of the fourth cycle in this way, the thin layer of the TiN film and the thin layer of the SiN film are alternately deposited on the wafer W, thereby forming the TiSiN film 63 as the target film.

Figure 12:
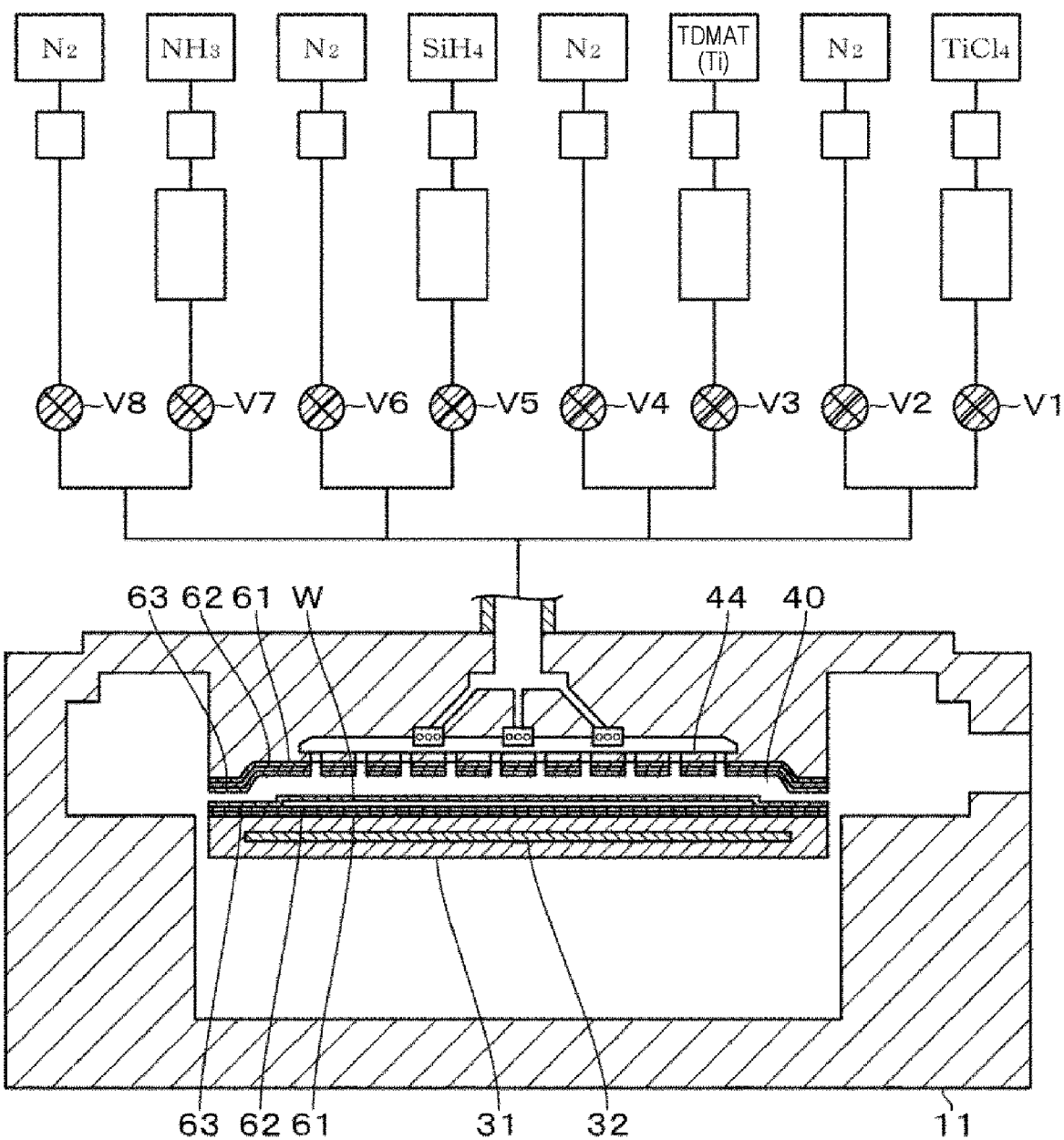
FIG. 12 is an explanatory view illustrating a film forming process performed on a wafer in the film-forming apparatus.

After the repetition of the third cycle and the repetition of the fourth cycle are performed a predetermined number of times, the valves V1 to V8 are closed and the film forming process is terminated (FIG. 12). The above step of forming the TiSiN film 63 is represented as step R5 in the flow chart. Thereafter, the wafer W is unloaded from the processing container 11 in an operation reverse to that when the wafer W is loaded into the processing container 11. In the above processing example, the fourth cycle is performed after the third cycle is repeatedly performed plural times. However, the fourth cycle may be performed after the third cycle is performed only once. Likewise, the third cycle may be performed after the fourth cycle is performed only once without being repeated plural times.

According to the film-forming apparatus 1, the TiN film 61 is formed as an underlying film of the pre-coating film by the $TiCl_4$ gas and the $NH_3$ gas, the internal temperature of the processing container 11 is decreased, and then the a-Si film 62 is formed as an upper-lying film of the pre-coating film on the TiN film 61 by the $SiH_4$ gas. Then, the wafer W is mounted on the a-Si film 62 formed on the mounting table 31 and the TiSiN film 63 is formed on the wafer W by using the TDMAT gas, the $SiH_4$ gas and the $NH_3$ gas. Since the a-Si film 62 is non-metallic, the back surface of the wafer W is not contaminated with metal by mounting the wafer W in such a manner. Further, since the a-Si film 62 covers the TiN film 61, the particles generated from the TiN film 61 by decreasing the internal temperature of the processing container 11 are prevented from being desorbed from the mounting table 31 and adhering to the wafer W. Therefore, the wafer W is prevented from being contaminated with metal due to the TiN particles. Further, the a-Si film 62 is formed using the $SiH_4$ gas used to form the TiSiN film 63 which is the target film to be formed on the wafer W. That is to say, since the pre-coating is performed using the $SiH_4$ gas supply source 55E, the MFC 54E, the flow path 52E and the valve V5 to form a film on the wafer W, the configuration of the film-forming apparatus 1 for pre-coating can be avoided from being complicated.

Second Embodiment

Figure 18:
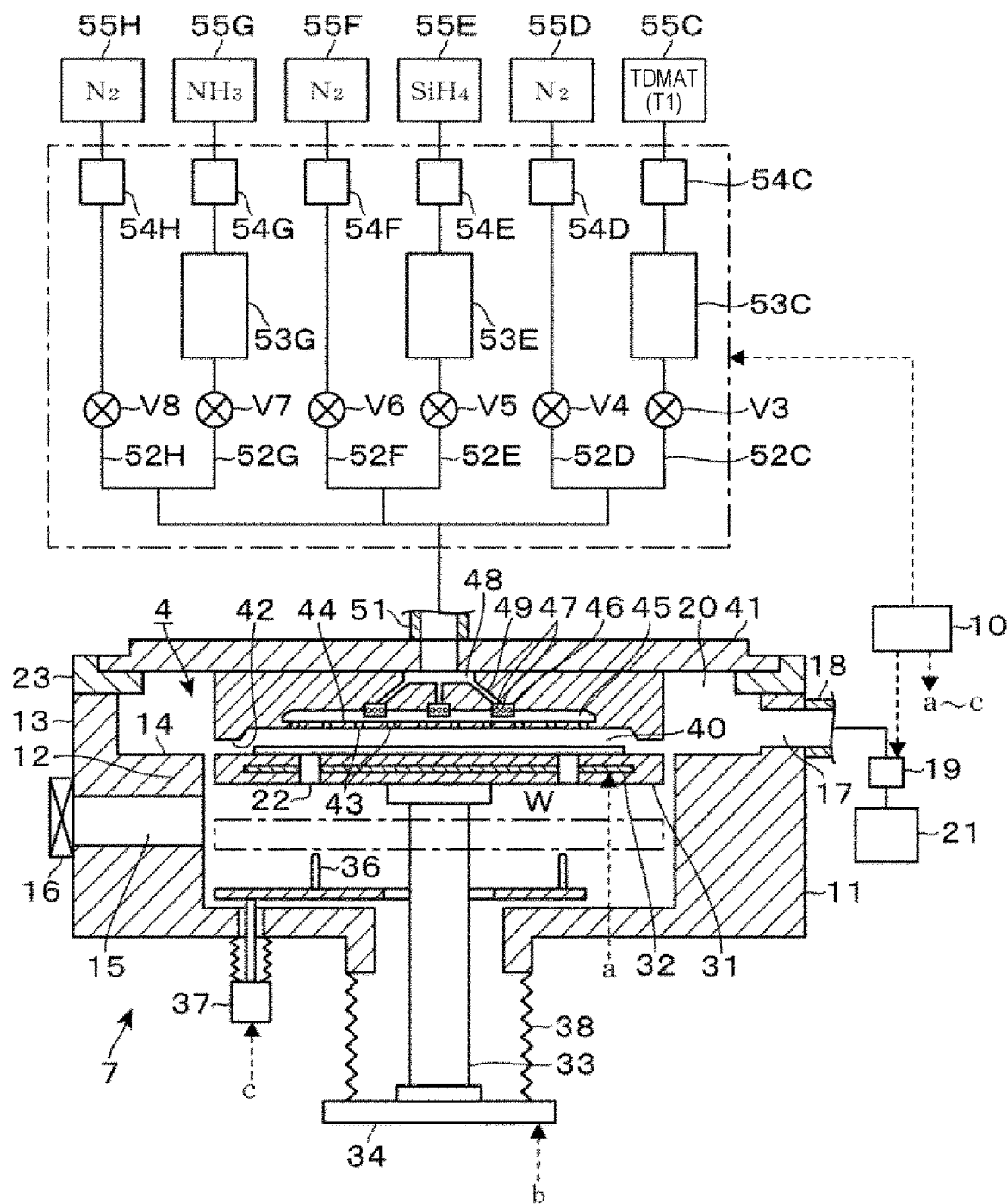
FIG. 18 is a longitudinal sectional side view of a film-forming apparatus according to a second embodiment of the present disclosure.

FIG. 18 illustrates a film-forming apparatus 7 according to a second embodiment of the present disclosure. The film-forming apparatus 7 is different from the film-forming apparatus 1 in that only three branch flow paths 56 are installed at the upstream side of the gas supply passage 51, and the flow paths 52A and 52B and the branch flow path 56 to which the flow paths 52A and 52B are connected are not installed. Therefore, the $TiCl_4$ gas supply source 55A and the $N_2$ gas supply source 55B connected respectively to the flow paths 52A and 52B are also not installed. Except for such differences, the film-forming apparatus 7 has the same configuration as the film-forming apparatus 1.

Figure 19:
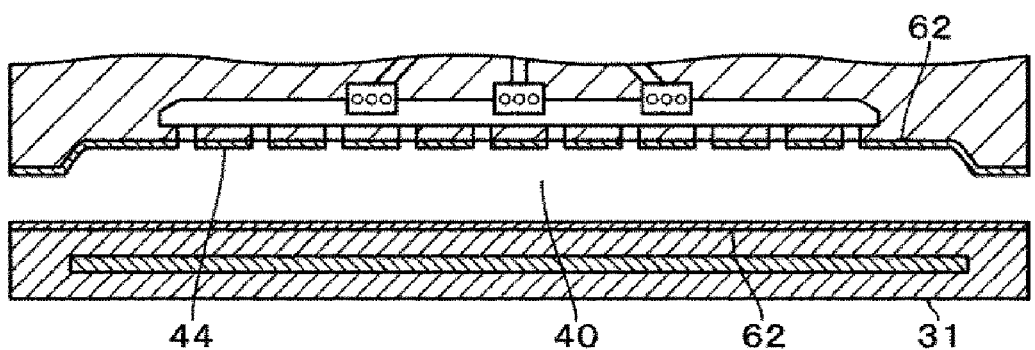
FIG. 19 is an explanatory view illustrating a pre-coating film formed by the film-forming apparatus.

Pre-coating and formation of a target film on a wafer W in the film-forming apparatus 7 will be described with a focus on the differences from the processing in the film-forming apparatus 1. First, in a state where the wafer W is not mounted on the mounting table 31, the above-described second cycle (the sequence of steps S5 and S6) is repeatedly performed to conduct a pre-coating by the a-Si film 62. In the pre-coating, the TiN film 61 is not formed unlike in the first embodiment. Thus, the internal temperature of the processing container 11 is set to, for example, 500 degrees C. to 650 degrees C., which is higher than the temperature at which the steps S5 and S6 in the first embodiment are performed, so that the $SiH_4$ gas is decomposed to generate a-Si. FIG. 19 illustrates the processing space 40 when the pre-coating is completed and the a-Si film 62 is formed.

Figure 20:
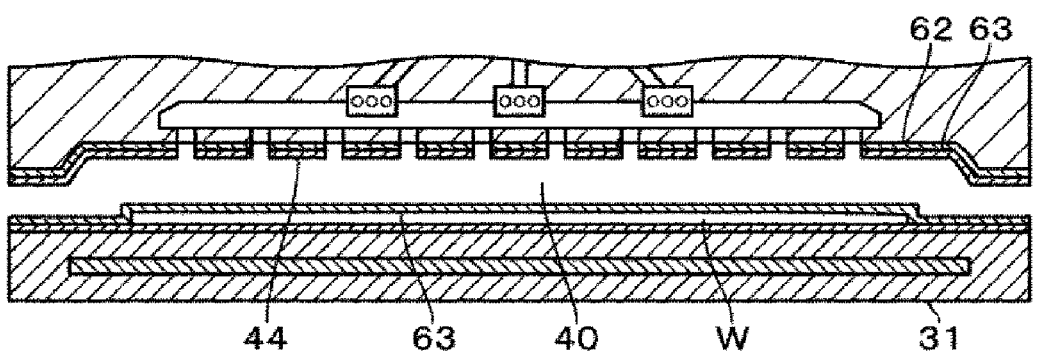
FIG. 20 is an explanatory view illustrating a film formed on a wafer by the film-forming apparatus.

Thereafter, the internal temperature of the processing container 11 is decreased to, for example, 150 degrees C. to 300 degrees C., as in the first embodiment, so that the TDMAT gas can be used to form a film. Then, as in the first embodiment, the wafer W is loaded into the processing container 11 and is mounted on the a-Si film 62 formed on the mounting table 31 with a back surface of the wafer W oriented to the mounting table 31. Then, as described with reference to FIGS. 8 to 11, the third cycle (the sequence of steps S7 to S10) and the fourth cycle (the sequence of steps S11 to S14) are alternately repeatedly performed once or more to form the TiSiN film 63 on the wafer W. FIG. 20 illustrates the processing space 40 when the TiSiN film 63 is formed in this way.

According to the film-forming apparatus 7, since the TiN film 61 is not formed, no particles are generated from the TiN film 61. Therefore, the back surface of the wafer W can be more reliably prevented from being contaminated with Ti. In addition, as in the first embodiment, since the a-Si film 62 as the pre-coating film in the second embodiment is formed by using the $SiH_4$ gas used to form the TiSiN film 63, it is possible to prevent the configuration of the film-forming apparatus 7 from being complicated. Further, since a film in contact with the back surface of the wafer W mounted on the mounting table 31 is the nonmetallic a-Si film 62, the wafer W is prevented from being contaminated with metal.

However, a film made of Si (silicon) which is the pre-coating film is not limited to the a-Si film 62. For example, in a state where the wafer W is not mounted on the mounting table 31, the above fourth cycle (the sequence of steps S11 to S14) may be repeatedly performed to form a SiN film as the pre-coating film. That is to say, instead of the a-Si film 62, a SiN film may be laminated on the TiN film 61 in the first embodiment, and a SiN film may be formed instead of the a-Si film 62 in the second embodiment. Even when the SiN film is used as the pre-coating film, since the gas used to form the TiSiN film 63 on the wafer W is used to form the SiN film, it is possible to prevent the configuration of the film-forming apparatus from being complicated. In each embodiment, a polysilicon film may be formed instead of the a-Si film 62 by setting the temperature at the time of supplying the $SiH_4$ gas to a temperature higher than the previously-mentioned temperature. In addition, the a-Si film 62 may be formed by continuously supplying the $SiH_4$ gas into the processing container 11 for a relatively long period of time. That is to say, the a-Si film 62 may be formed by CVD. Further, the gas for forming the a-Si film 62 and the TiSiN film 63 is not limited to the $SiH_4$ gas but may be a $Si_2H_6$ gas or the like. Further, the target film formed on the wafer W may be a TiN film containing no Si. That is to say, the third cycle (the sequence of steps S7 to S10) may be repeatedly performed to form a TiN film containing no Si as the target film on the wafer W from the TDMAT gas and the $NH_3$ gas.

By the way, in forming the TiN film, instead of TDMAT, for example, tetrakisethylmethylaminotitanium, tetrakisdi-ethylaminotitanium or the like may be used as the organometallic compound containing Ti. However, the metal compound formed as the pre-coating film and the target film is not limited to a titanium (Ti) compound. For example, in the first embodiment, instead of the TiN film 61, a tantalum nitride (TaN) film may be formed as the pre-coating film, which is an underlying film, by ALD using a $TaCl_5$ gas and a $NH_3$ gas. Further, instead of the TiN film, a TaN film may be formed as the target film by ALD using a gas such as tertiary butylimide-tri-diethylamide tantalum (TBTDET) or pentaethoxytantalum (PET) containing tantalum (Ta) and a $NH_3$ gas. Likewise, in the second embodiment, instead of the TiN film, a TaN film may be formed by ALD using an organometallic compound gas containing tantalum (Ta) and a $NH_3$ gas. In addition, an aluminum nitride (AlN) film may be formed by an organometallic compound gas containing aluminum, such as trimethylaluminum, and a $NH_3$ gas. That is to say, the present disclosure is not limited to a case where a metal film composed of Ti is formed on the wafer W.

Further, in the first embodiment, instead of the $NH_3$ gas which is a gas containing nitrogen, for example, an oxygen ($O_2$) gas, an ozone gas or the like may be supplied to perform oxidation to form a metal oxide film. Specifically, a $TiCl_4$ gas and an $O_2$ gas may be used to form a titanium oxide ($TiO_2$) film instead of the TiN film 61 as the pre-coating film. In addition, a TDMAT gas and an $O_2$ gas may be used to form a $TiO_2$ film as the target film formed on the wafer W. That is to say, the present disclosure is not limited to a case where a metal nitride film is formed on the wafer W. In addition, the present disclosure may also be applied to a case where a metal film is formed on the wafer W by decomposing an organometallic compound gas by the heat of the surface of the wafer W. Further, the TiN film which is the underlying film of the pre-coating film in the first embodiment may be formed by performing the third cycle (the sequence of steps S7 to S10) repeatedly, namely by using the TDMAT gas instead of the TiCl$_4$ gas. In that case, the interior of the processing container 11 is set to 150 degrees C. to 300 degrees C. from the start of formation of the pre-coating film until the completion of formation of the target film so that the TDMAT gas is not decomposed. The above-described embodiments are not intended to limit the present disclosure and may be appropriately changed or used in combination.

(Evaluation Test)

Hereinafter, an evaluation test carried out in connection with the present disclosure will be described. In this evaluation test, after a pre-coating film is formed in the processing container 11, a wafer W is loaded into the processing container 11 heated to 200 degrees C. and is mounted on the mounting table 31. Thereafter, as a sample, the number of atoms per 1 cm$^2$ was measured on the back surface of the wafer W unloaded from the processing container 11 by using a total internal reflection fluorescent X-ray analyzer. The type of the pre-coating film formed in the processing container 11 was changed each time the measurement is made and differences in the number of atoms measured were examined.

Specifically, the previously-mentioned third cycle (the sequence of steps S7 to S10) was repeatedly performed with the internal temperature of the processing container 11 set to 200 degrees C. That is to say, a TiN film formed by TDMAT was used as the pre-coating film. The wafer W loaded into the processing container 11 when this pre-coating film is formed is referred to as Sample 1. In addition, the previously-mentioned first cycle (the sequence of steps S1 to S4) was repeatedly performed with the internal temperature of the processing container 11 set to 460 degrees C. That is to say, with the TiN film formed of TiCl$_4$ as the pre-coating film, the internal temperature of the processing container 11 was decreased to 200 degrees C. and then the wafer W was loaded into the processing container 11. This wafer W is referred to as Sample 2.

In addition, in the same manner as the formation of the pre-coating film at the time of loading the wafer W of Sample 2, the internal temperature of the processing container 11 was set to 460 degrees C., a TiN film was formed as the pre-coating film by a TiCl$_4$ gas, the internal temperature of the processing container 11 was decreased to 200 degrees C., and the second cycle (the sequence of steps S5 and S6) was performed ten times. That is to say, in the same manner as in the above-described first embodiment, the pre-coating film composed of the TiN film 61 and the a-Si film 62 was formed and the wafer W was loaded into the processing container 11. This wafer W is referred to as Sample 3. Then, in the same manner as the formation of the pre-coating film at the time of loading the wafer W of Sample 3, the pre-coating film composed of the TiN film 61 and the a-Si film 62 was formed and the second cycle was performed 200 times to make the film thickness of the a-Si film 62 larger than that at the time of loading the wafer W of Sample 3. The wafer W loaded into the processing container 11 when this pre-coating film was formed is referred to as Sample 4.

Results of measurement on Ti atoms in Samples 1 to 4 were 276121.5×10$^{10}$ atms/cm$^2$ for Sample 1, 472.658×10$^{10}$ atms/cm$^2$ for Sample 2, 52.728×10$^{10}$ atms/cm$^2$ for Sample 3, and 10.891×10$^{10}$ atms/cm$^2$ for Sample 4. Thus, among Samples 1 to 4, Sample 1 has the largest number of adhered Ti atoms. This is believed to be due to the fact that the pre-coating film of TiN formed by TDMAT has low adhesion to the mounting table 31 and tends to peel off from the mounting table 31. Sample 2 has also the relatively large number of adhered Ti atoms. This is believed to be due to cracking of the TiN film 61 by the decrease in temperature inside the processing container 11 as described with reference to FIGS. 15 and 16.

However, in Samples 3 and 4 pre-coated in the first embodiment of the present disclosure, the number of adhered Ti atoms is greatly smaller than those in Samples 1 and 2. Therefore, the effects of the present disclosure were confirmed from this evaluation test. Sample 4 having a larger thickness of the a-Si film 62 has the smaller number of adhered Ti atoms than Sample 3. Therefore, it can be understood that Ti atoms are more reliably prevented from adhering to the wafer W by forming an a-Si film so as to have an appropriate film thickness.

According to the present disclosure in some embodiments, a gas containing an organometallic compound is supplied into a processing container, a gas containing silicon is supplied into the processing container in which a substrate is not loaded before forming a film made of metal contained in the gas on the substrate. Surfaces of members installed inside the processing container, including a mounting table, are coated with a film made of silicon. The substrate is mounted on the mounting table so that a back surface of the substrate is in contact with the film. By performing such film formation, it is possible to prevent the back surface of the substrate from being contaminated with metal. Further, when a metal film is formed on the substrate so as to contain silicon, there is no need to additionally provide an equipment for performing a pre-coating with such a film made of silicon. It is therefore possible to prevent the configuration of the film-forming apparatus from being complicated.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film-forming method, comprising:
   a pre-coating process of supplying a pre-coating gas and a first gas containing silicon into a processing container in which a substrate is not loaded, and coating surfaces of members installed inside the processing container, including a mounting table configured to mount the substrate thereon, with a film made of silicon;
   subsequently, a mounting process of mounting the substrate on the mounting table so that a back surface of the substrate is in contact with the film made of silicon; and
   subsequently, a film-forming process of supplying a second gas containing an organometallic compound into the processing container, and forming a film made of a metal constituting the organometallic compound on the substrate,
   wherein the pre-coating process includes:
   a first pre-coating process of supplying the pre-coating gas, which is a compound different from the organometallic compound and contains the metal constituting the organometallic compound, into the processing container to form an underlying film containing the metal on the members installed inside the processing container; and subsequently, a second pre-coating process of supplying the first gas into the processing container to form a film made of the silicon so as to be laminated on the underlying film.

2. The method of claim 1, wherein the film-forming process further includes supplying the first gas into the processing container to form a film containing the metal and the silicon on the substrate.

3. The method of claim 2, wherein the film-forming process further includes supplying a third gas as a compound containing nitrogen into the processing container to form a film containing the metal, the silicon, and the nitrogen on the substrate.

4. The method of claim 1, wherein the first pre-coating process is performed in a state where an internal temperature of the processing container is set to a first temperature, and the second pre-coating process is performed in a state where the internal temperature of the processing container is set to a second temperature that is lower than the first temperature.

5. The method of claim 4, wherein the first temperature is equal to or higher than 400 degrees C., and the second temperature is equal to or lower than 300 degrees C.

6. The method of claim 1, wherein the pre-coating gas is composed of a chloride of the metal, and the second gas does not contain chlorine as a constituent.

7. The method of claim 1, wherein the metal is titanium.

8. The method of claim 1, wherein the film made of silicon is an amorphous silicon film.

* * * * *